United States Patent
Lorenzo

(10) Patent No.: US 11,526,992 B2
(45) Date of Patent: *Dec. 13, 2022

(54) IMAGERY-BASED CONSTRUCTION PROGRESS TRACKING

(71) Applicant: Structionsite Inc., Oakland, CA (US)

(72) Inventor: Philip Garcia Lorenzo, Sacramento, CA (US)

(*) Notice: Subject to any disclaimer, the term of this patent is extended or adjusted under 35 U.S.C. 154(b) by 428 days.

This patent is subject to a terminal disclaimer.

(21) Appl. No.: 16/673,511

(22) Filed: Nov. 4, 2019

(65) Prior Publication Data

US 2020/0065971 A1 Feb. 27, 2020

Related U.S. Application Data

(63) Continuation of application No. 16/509,340, filed on Jul. 11, 2019, now Pat. No. 10,467,758.

(60) Provisional application No. 62/697,472, filed on Jul. 13, 2018.

(51) Int. Cl.
| | |
|---|---|
| *H04N 5/232* | (2006.01) |
| *G06V 10/44* | (2022.01) |
| *G06V 20/40* | (2022.01) |
| *G06T 7/11* | (2017.01) |
| *G06T 11/20* | (2006.01) |

(52) U.S. Cl.
CPC ............ *G06T 7/11* (2017.01); *G06T 11/203* (2013.01); *G06V 10/44* (2022.01); *G06V 20/46* (2022.01); *H04N 5/23238* (2013.01)

(58) Field of Classification Search
None
See application file for complete search history.

(56) References Cited

U.S. PATENT DOCUMENTS

| | | | |
|---|---|---|---|
| 7,852,369 B2* | 12/2010 | Cutler | ............... H04N 5/23203 |
| | | | 348/14.09 |
| 8,635,104 B2 | 1/2014 | Adams | |
| 8,705,892 B2 | 4/2014 | Aguilera et al. | |
| 8,818,768 B1 | 8/2014 | Fan et al. | |
| 8,866,913 B1 | 10/2014 | Hsieh et al. | |
| 8,893,026 B2 | 11/2014 | Lindemann et al. | |
| 9,207,518 B2 | 12/2015 | Mueller et al. | |
| 9,222,771 B2 | 12/2015 | Rosengaus et al. | |
| 9,239,892 B2 | 1/2016 | Schmidt et al. | |

(Continued)

FOREIGN PATENT DOCUMENTS

| | | |
|---|---|---|
| WO | WO2004109385 | 12/2004 |
| WO | WO2017201092 | 11/2017 |
| WO | WO2018055459 | 3/2018 |

*Primary Examiner* — Nancy Bitar
(74) *Attorney, Agent, or Firm* — Thomas J. Lavan

(57) ABSTRACT

A method is provided. The method includes one or more of receiving, by an image processing device, one or more images from an image capture device. The one or more images are each associated with metadata that includes a common direction. For each of the one or more images, the method further includes adding one or more pairs of parallel lines, converting each of the one or more pairs of parallel lines into intersection coordinates with 2D drawing elements, and calculating construction progress from the intersection coordinates. The 2D drawing includes a 2D floor plan or a 2D elevation plan, and each pair of parallel lines designates one of the start or end of construction during a current period of time.

17 Claims, 21 Drawing Sheets

(56) References Cited

U.S. PATENT DOCUMENTS

| | | |
|---|---|---|
| 9,311,397 B2 | 4/2016 | Meadow et al. |
| 9,324,190 B2 | 4/2016 | Bell et al. |
| 9,324,911 B2 | 5/2016 | Sheridan et al. |
| 9,330,501 B2 * | 5/2016 | Sahoo .................... G09G 5/026 |
| 9,420,176 B2 | 8/2016 | Hsieh et al. |
| 9,438,800 B1 | 9/2016 | Kozko |
| 9,501,700 B2 | 11/2016 | Loveland et al. |
| 9,536,148 B2 | 1/2017 | Gross |
| 9,648,234 B2 | 5/2017 | Hsieh et al. |
| 9,742,996 B1 * | 8/2017 | Martin ............... H04N 5/23238 |
| 10,467,758 B1 * | 11/2019 | Lorenzo ................ G06V 10/44 |
| 10,878,138 B2 * | 12/2020 | Ullom .................. G06T 19/003 |
| 2004/0001091 A1 | 1/2004 | Kressin |
| 2010/0231687 A1 | 9/2010 | Amory et al. |
| 2014/0125768 A1 | 5/2014 | Bell et al. |
| 2014/0152651 A1 | 6/2014 | Chen et al. |
| 2014/0279247 A1 | 9/2014 | Leuer et al. |
| 2015/0310135 A1 | 10/2015 | Forsyth et al. |
| 2015/0310669 A1 | 10/2015 | Kamat et al. |
| 2016/0012160 A1 | 1/2016 | Mohacsi et al. |
| 2016/0042568 A1 | 2/2016 | Farnham et al. |
| 2016/0117785 A1 | 4/2016 | Lerick et al. |
| 2016/0146604 A1 | 5/2016 | Metzler et al. |
| 2017/0028564 A1 | 2/2017 | Lowy |
| 2017/0032581 A1 | 2/2017 | Petrucci et al. |
| 2017/0034112 A1 | 2/2017 | Perlegos |
| 2017/0280114 A1 | 9/2017 | Samuelson et al. |
| 2017/0330398 A1 * | 11/2017 | Jordan .................... H04N 5/77 |
| 2020/0005428 A1 * | 1/2020 | Sedeffow ............. G06T 3/0006 |

\* cited by examiner

Fig. 1A  Building Location Image Capture Environment
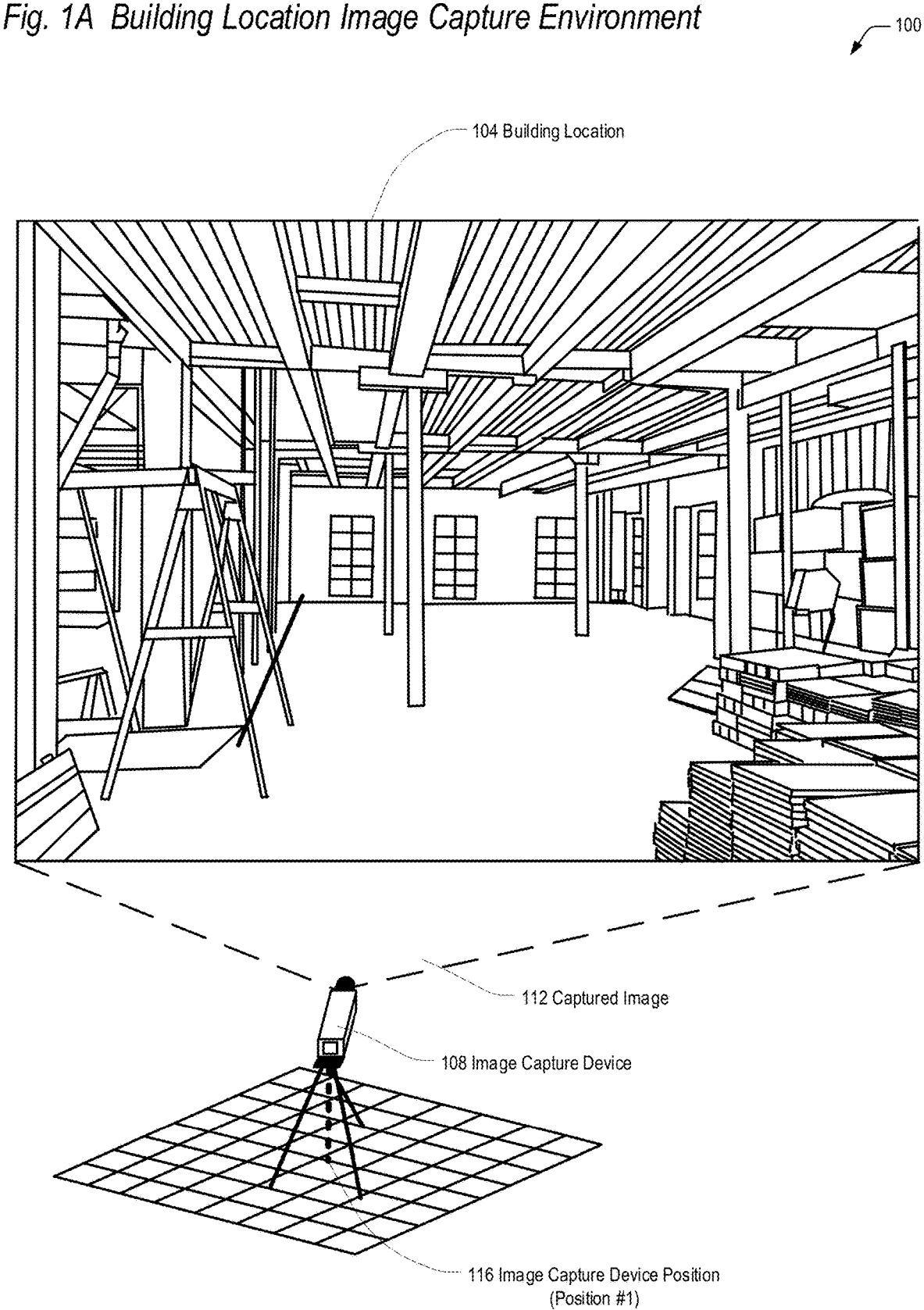

Fig. 1B  Image Processing Environment
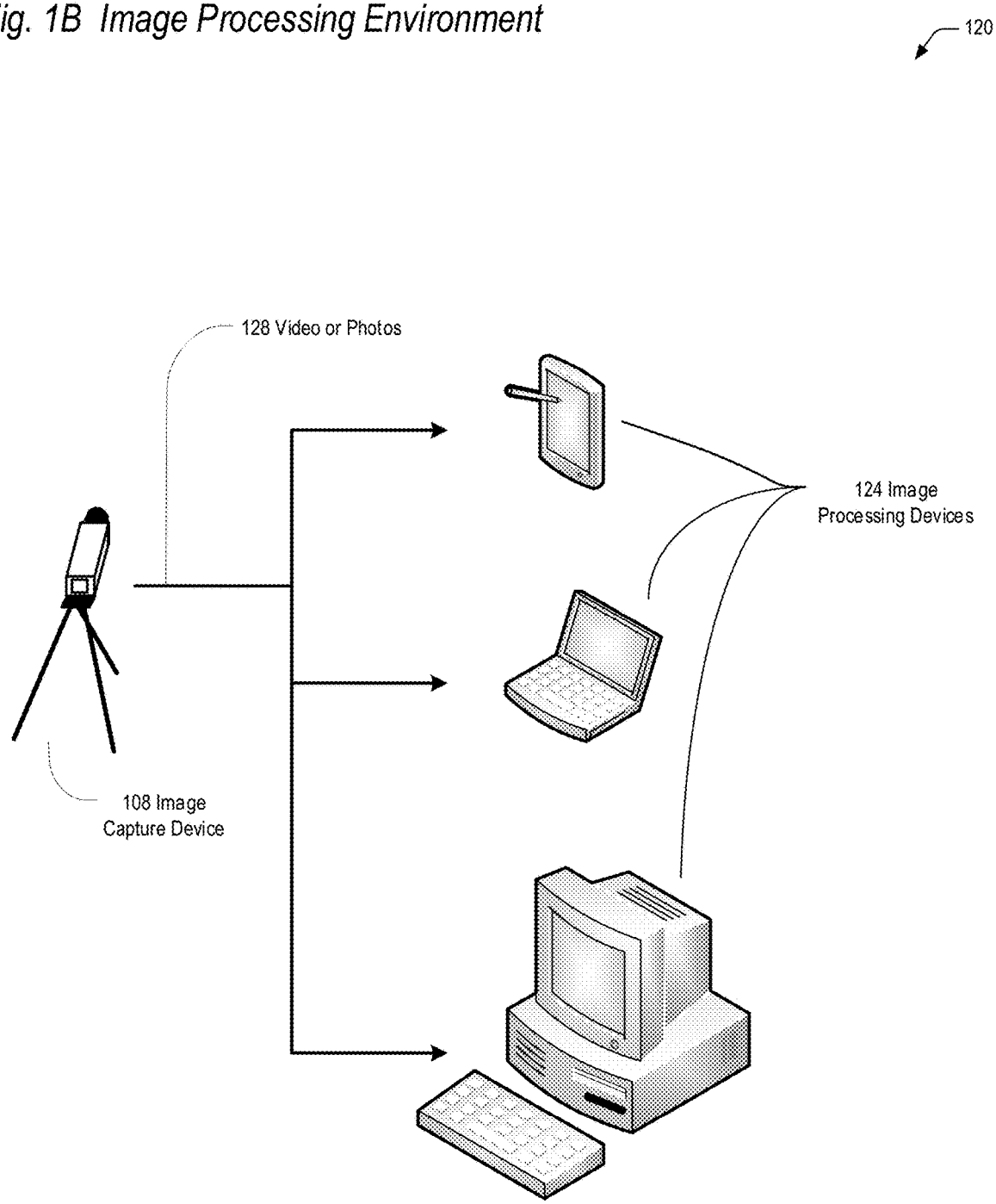

Fig. 2 Image Processing Device Block Diagram
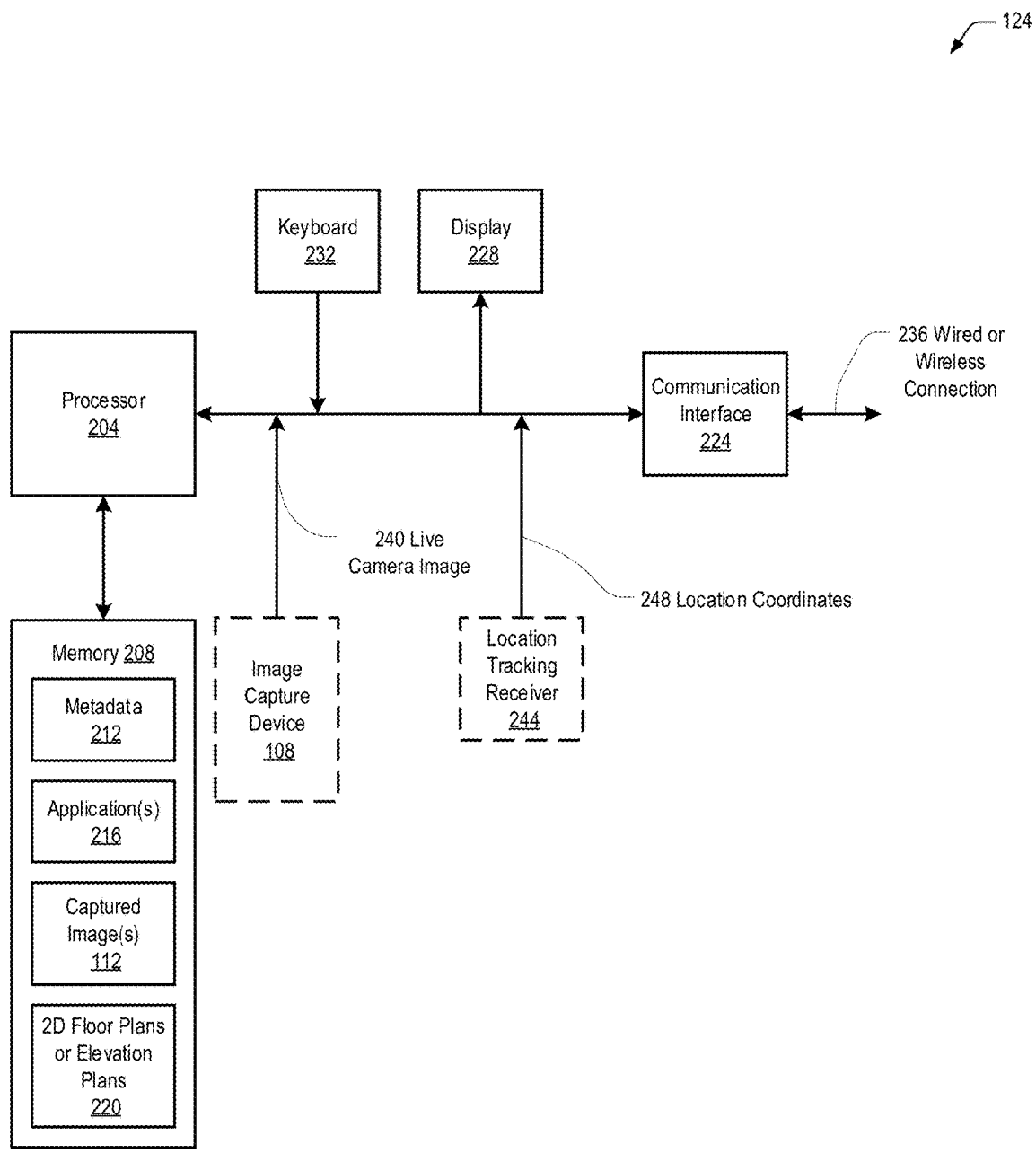

Fig. 3 Camera View Orientation
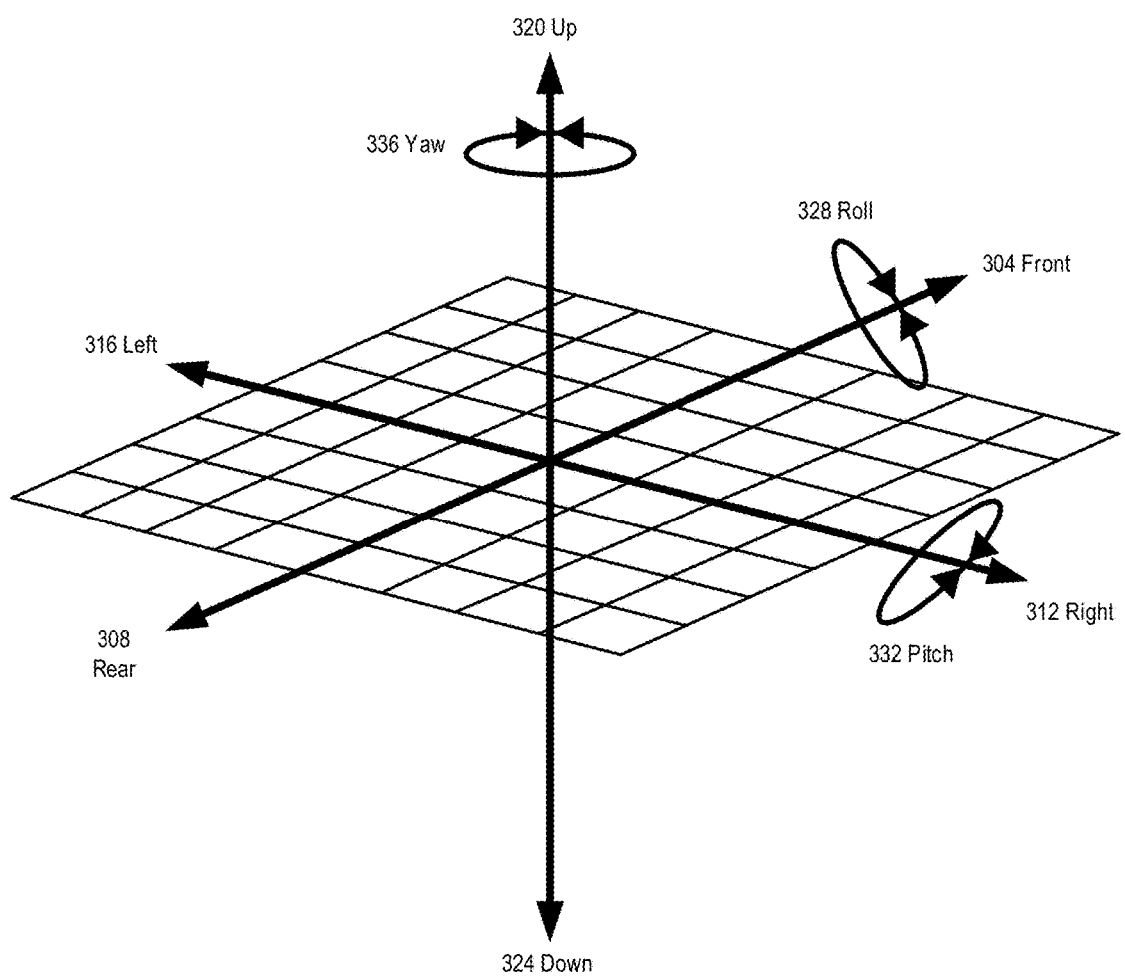

*Fig. 4 Image Locations on 2D Floor Plan*
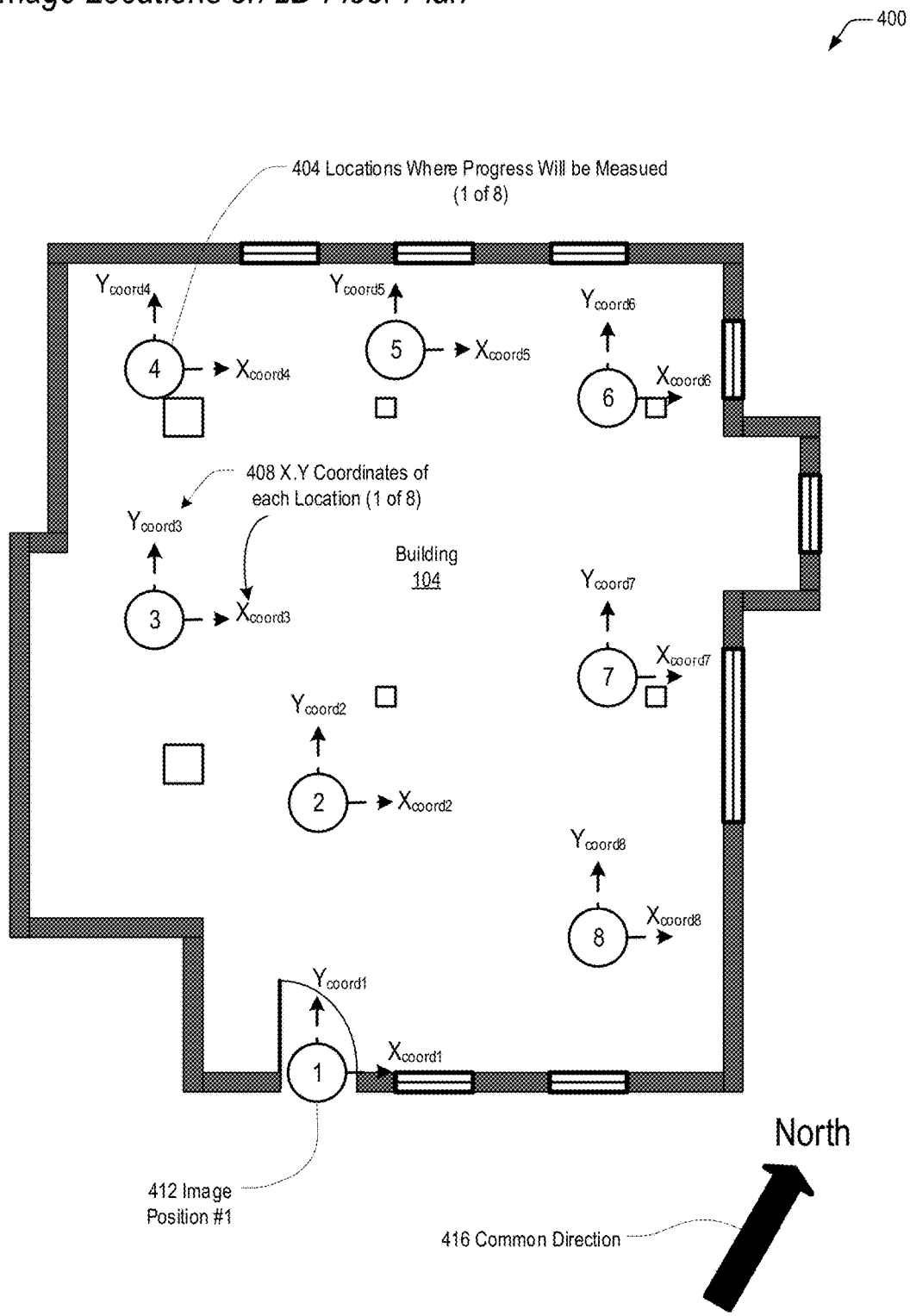

Fig. 5A Image Capture from Video Walkthrough
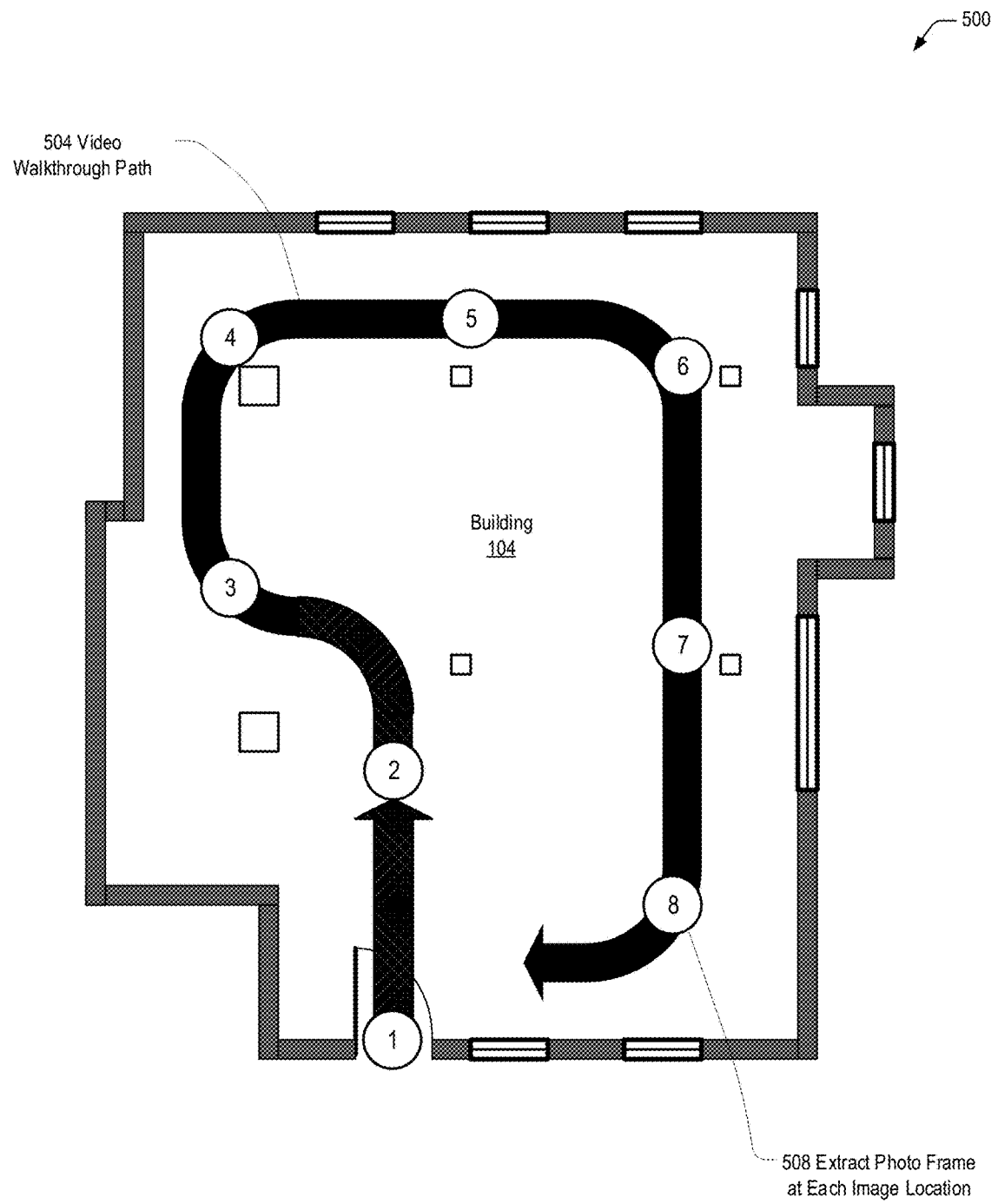

*Fig. 5B Image Capture From 360 Degree Photos*
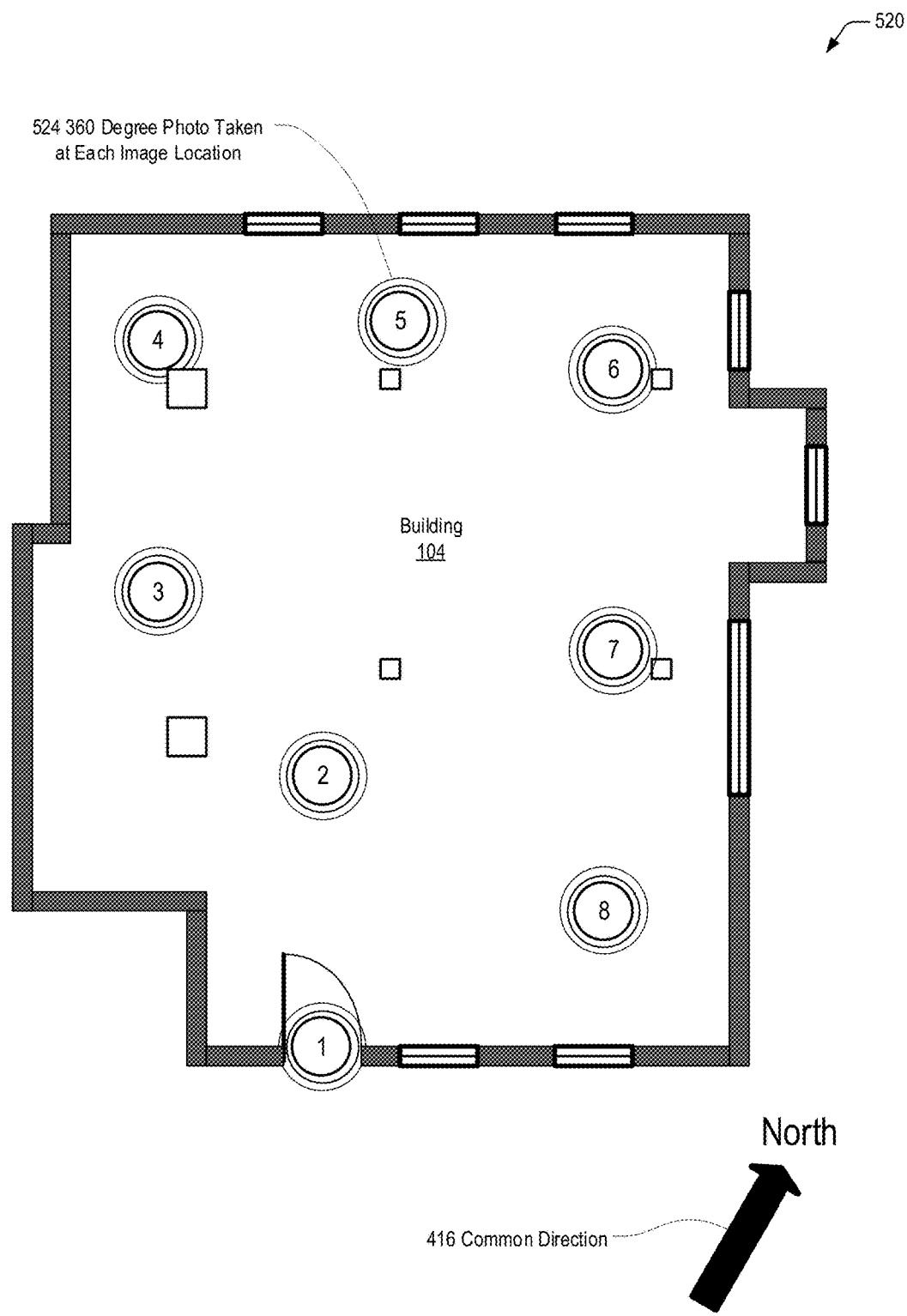

*Fig. 5C Image Capture From Non-360 Degree Photos*
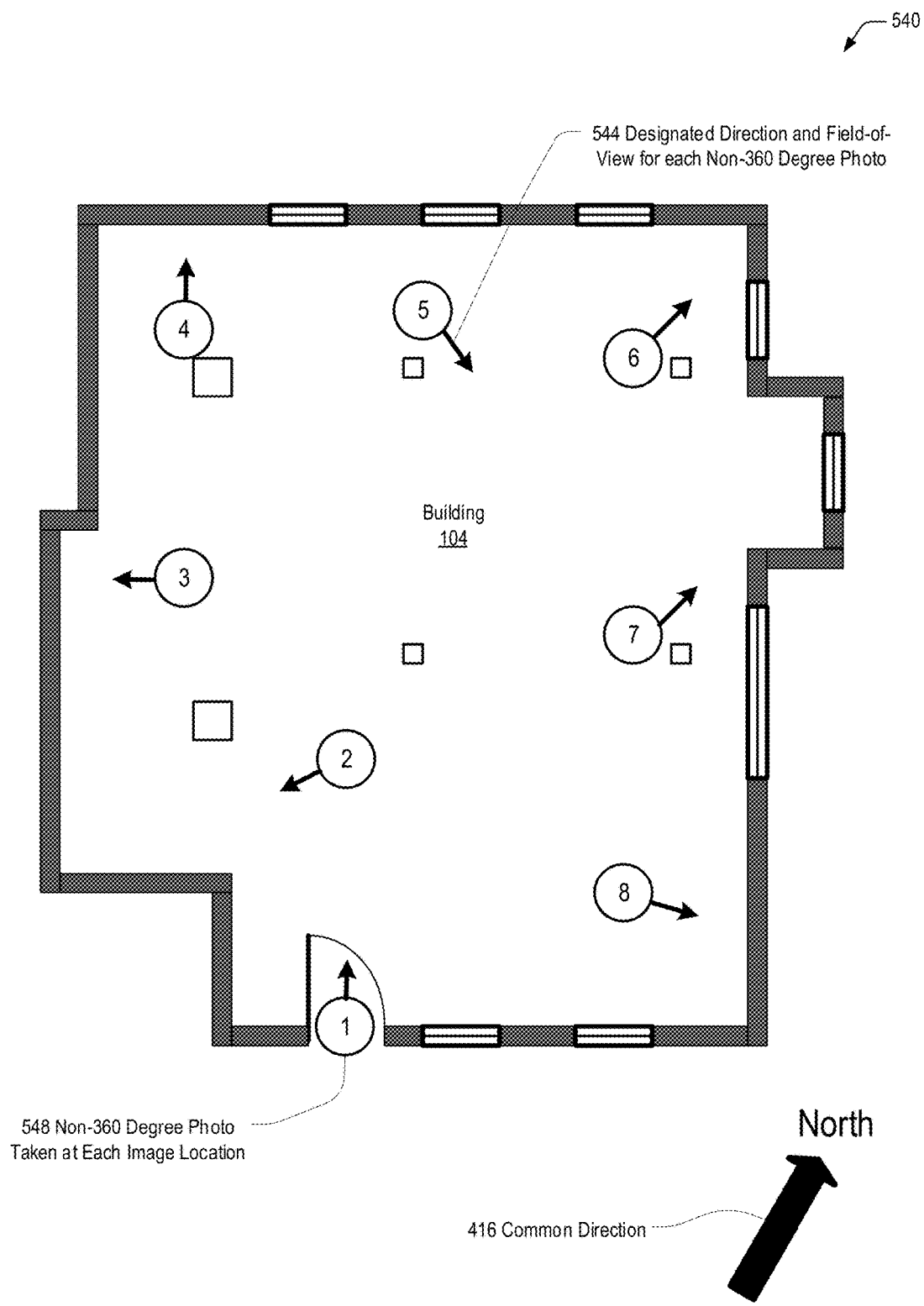

*Fig. 6A Add Yaw Lines to Photo/Frame*

*Fig. 6B Photo/Frame Before Segmentation*
624 Photo or Frame
608 Yaw Line at 250 Degrees to Common Direction
612 Yaw Line at 260 Degrees to Common Direction Fig. 6C Segmented Areas Within Photo/Frame
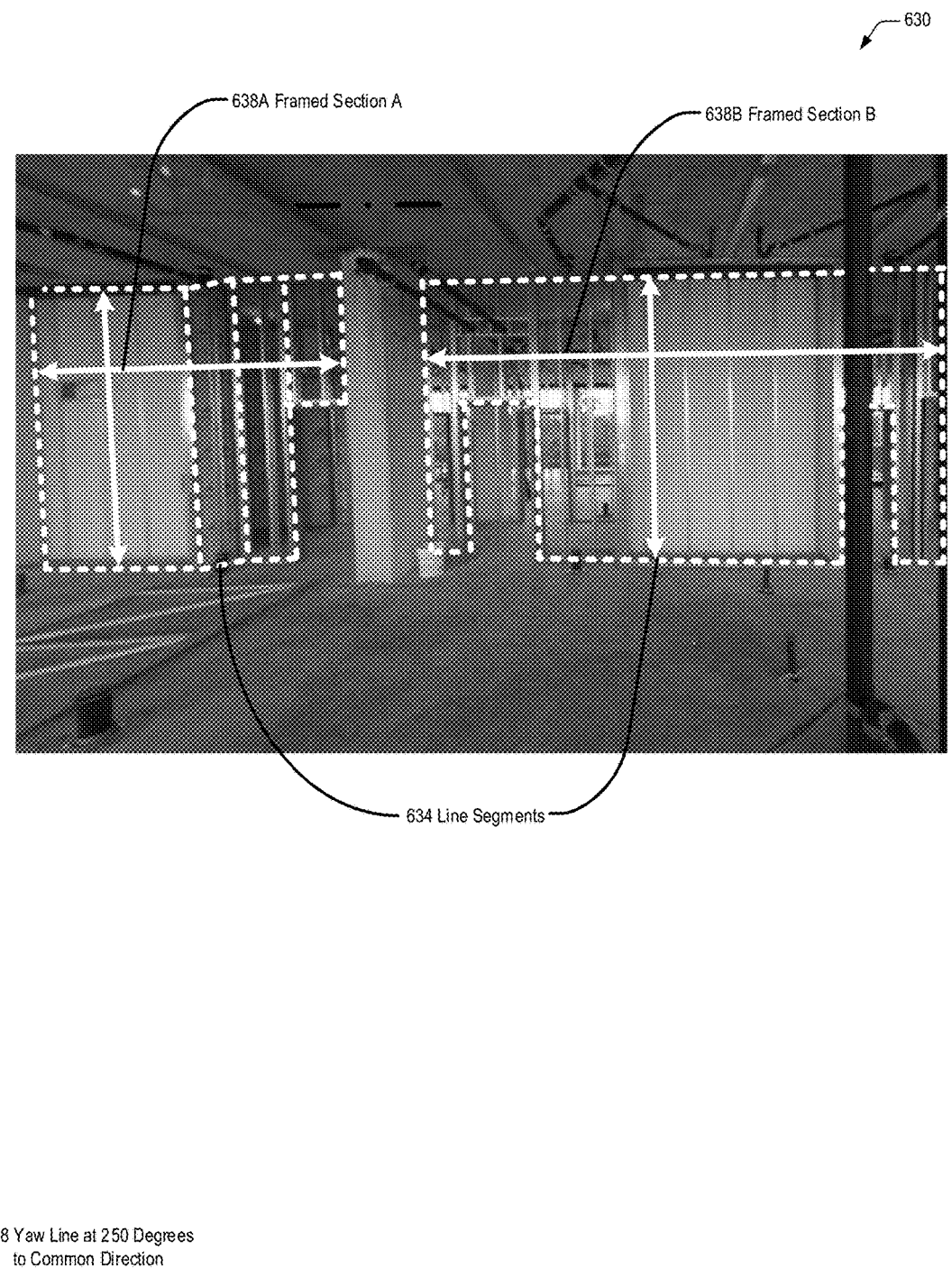

Fig. 6D  Yaw and Pitch Line Pairs Within Photo/Frame
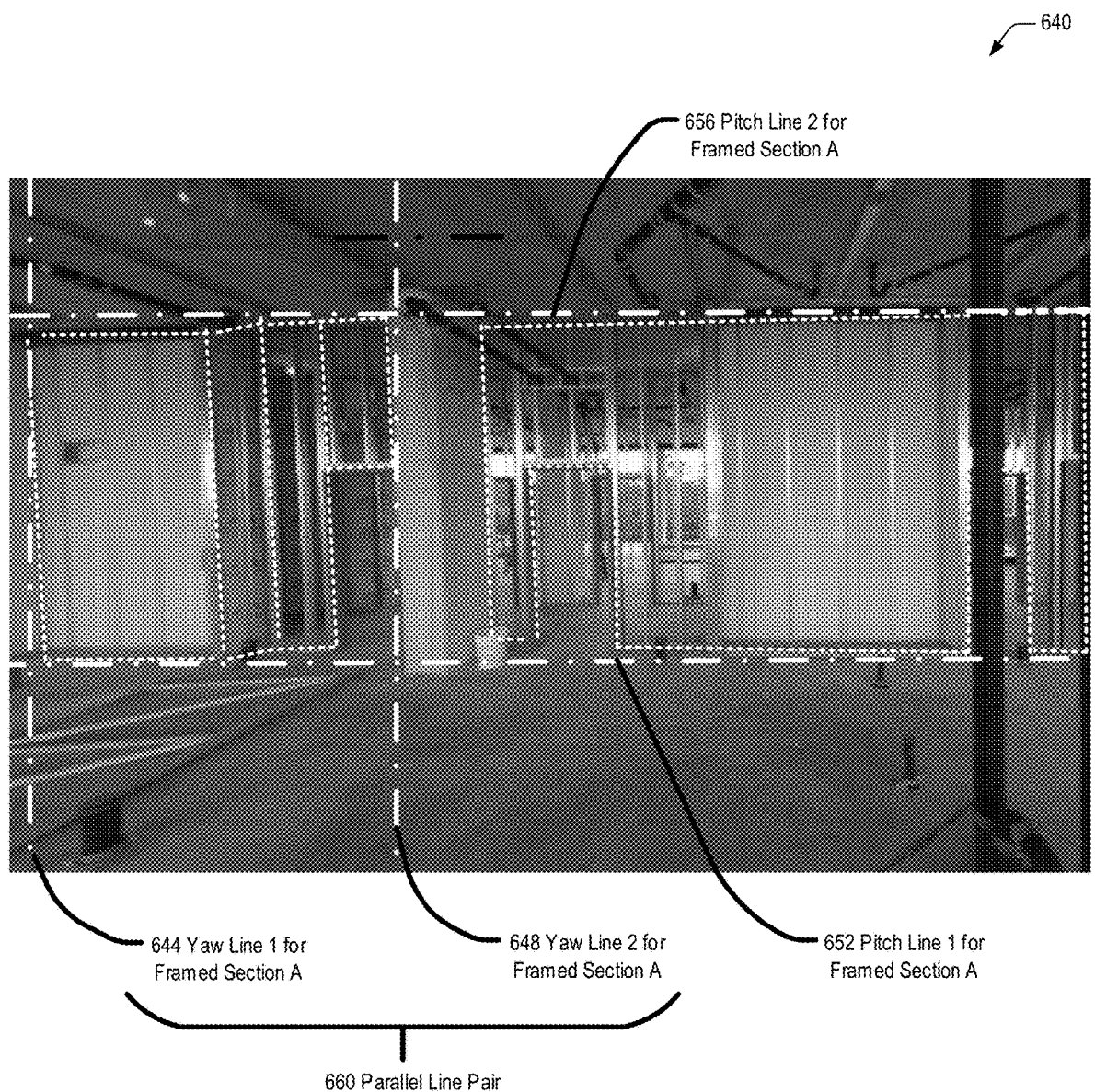

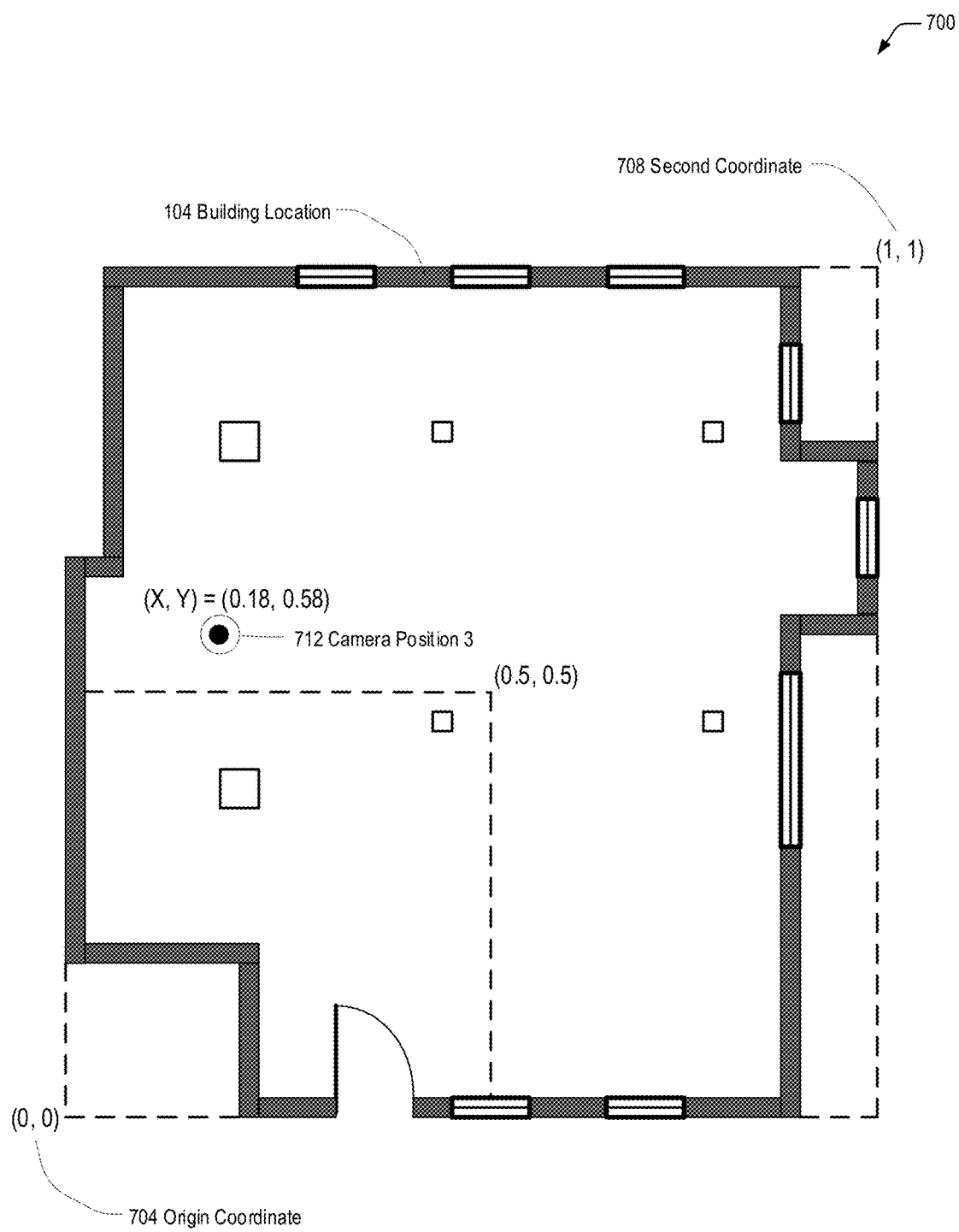
Fig. 7 Coordinate System For 2D Floor Plan

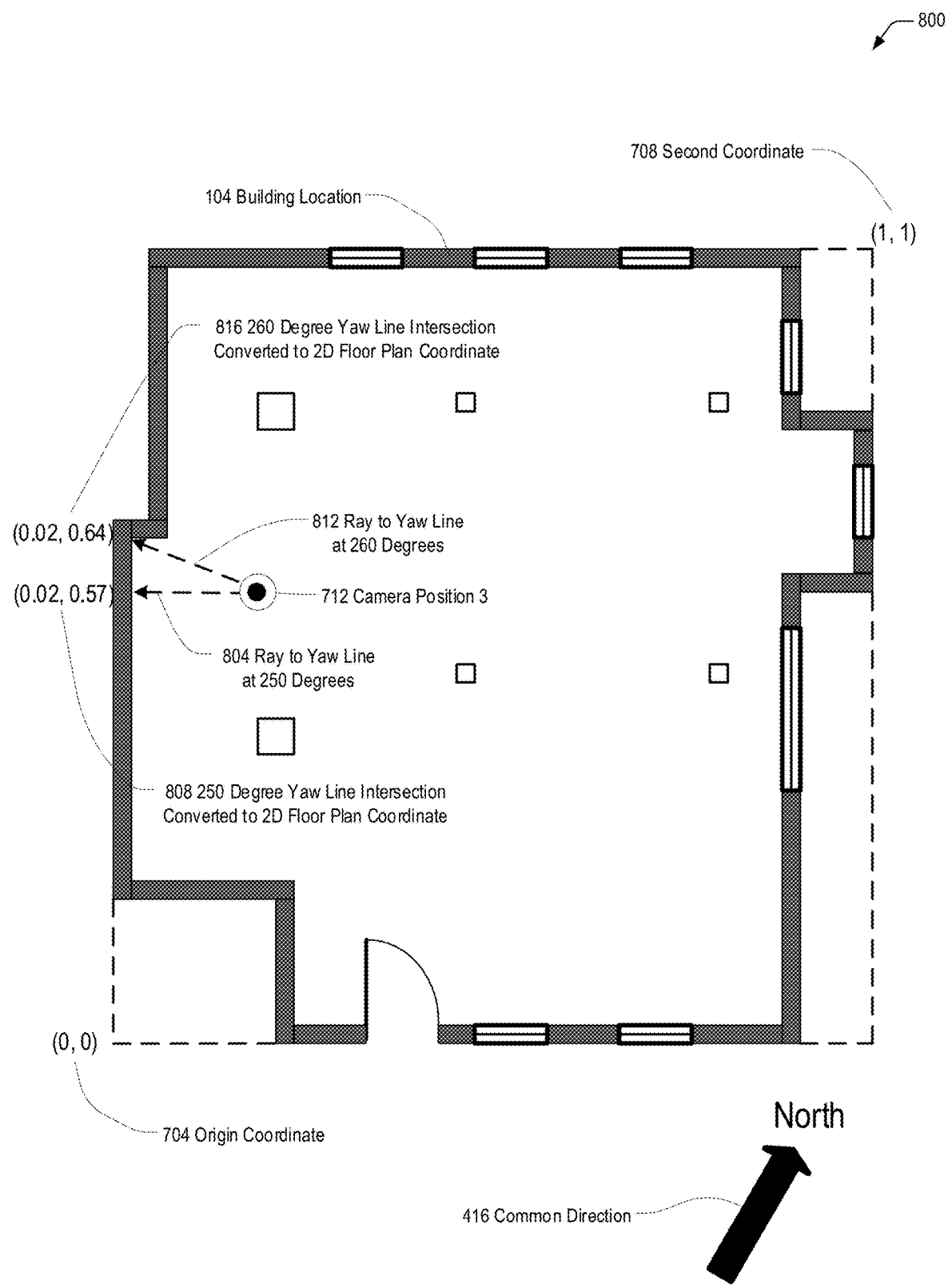
Fig. 8 Coordinate Determination From Yaw Lines

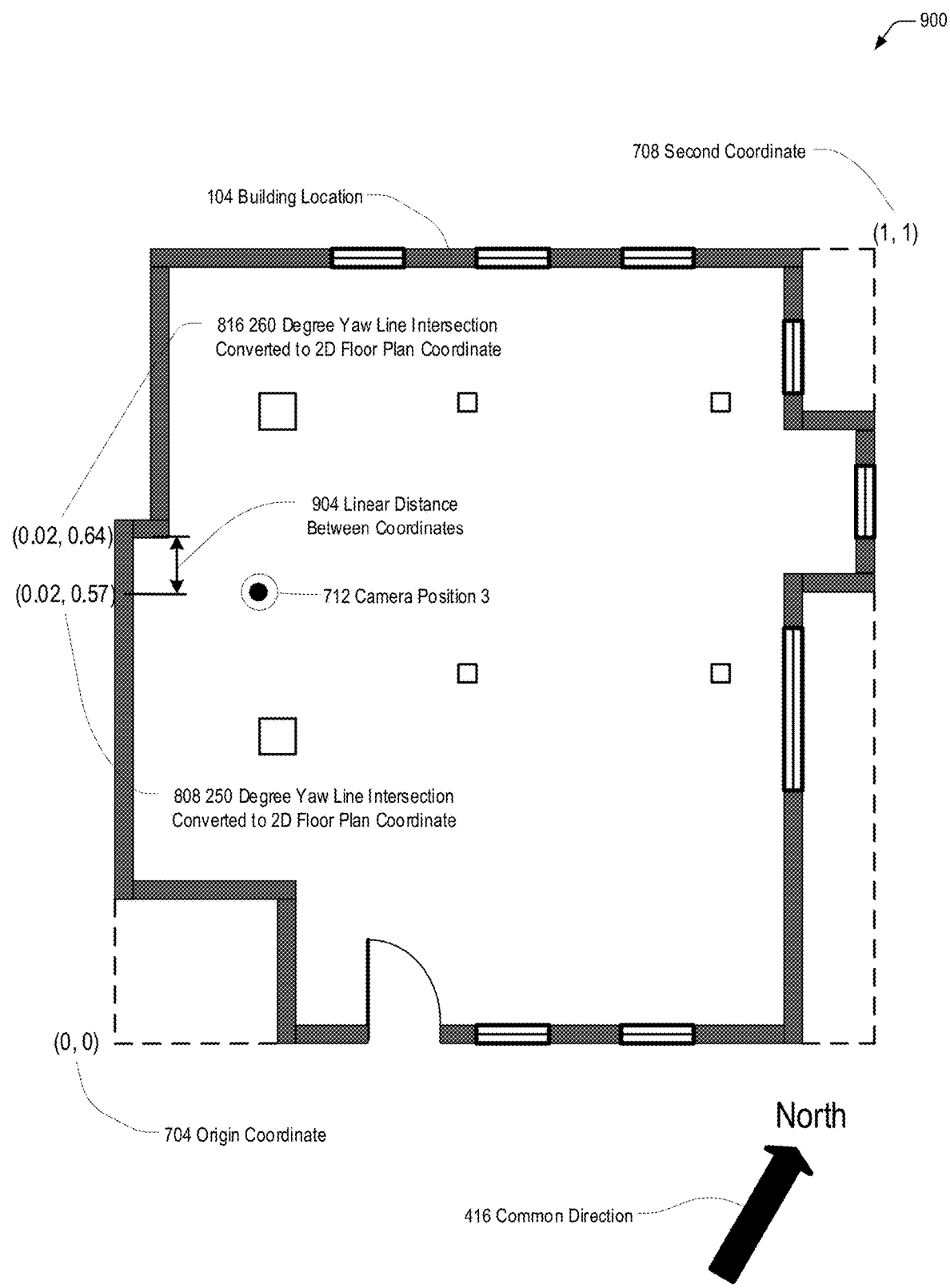
Fig. 9 Linear Distance Determination from Coordinates

Fig. 10 Trigger Process for Progress Measurement
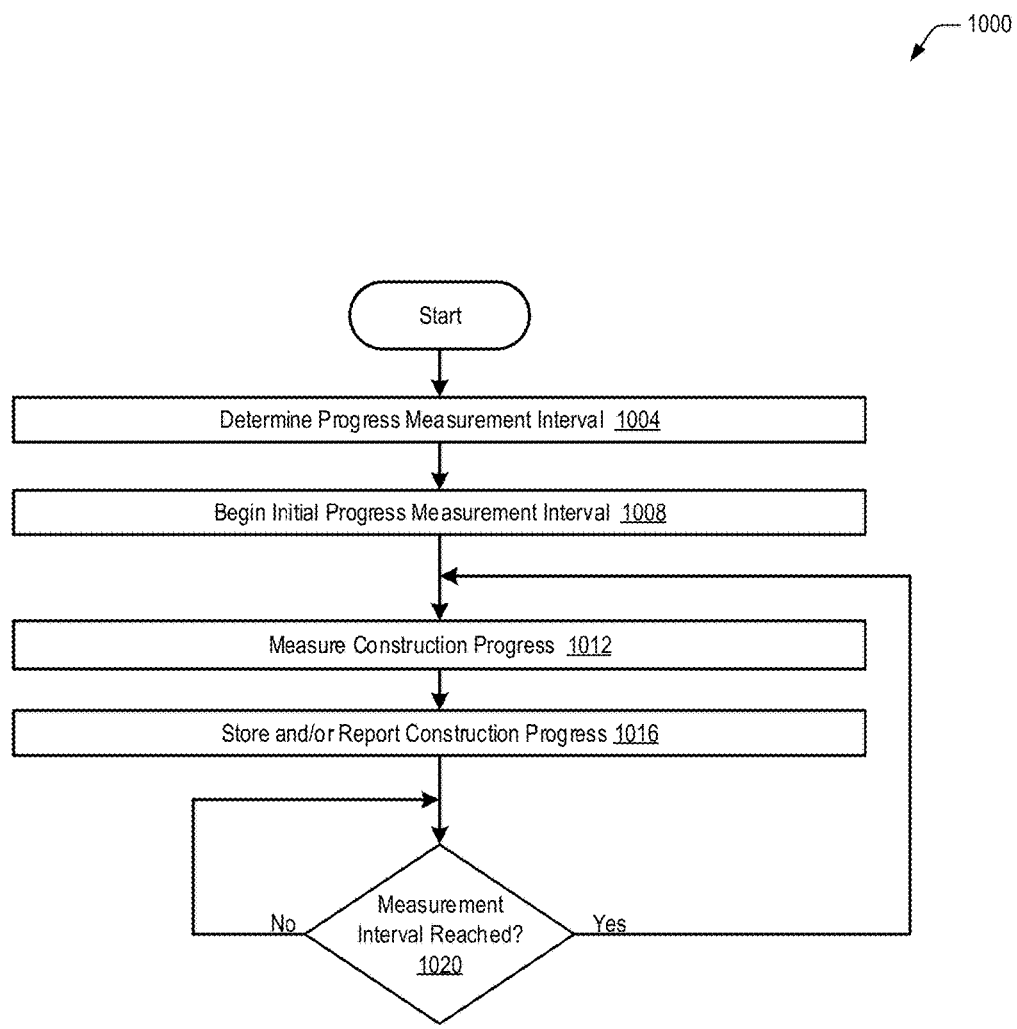

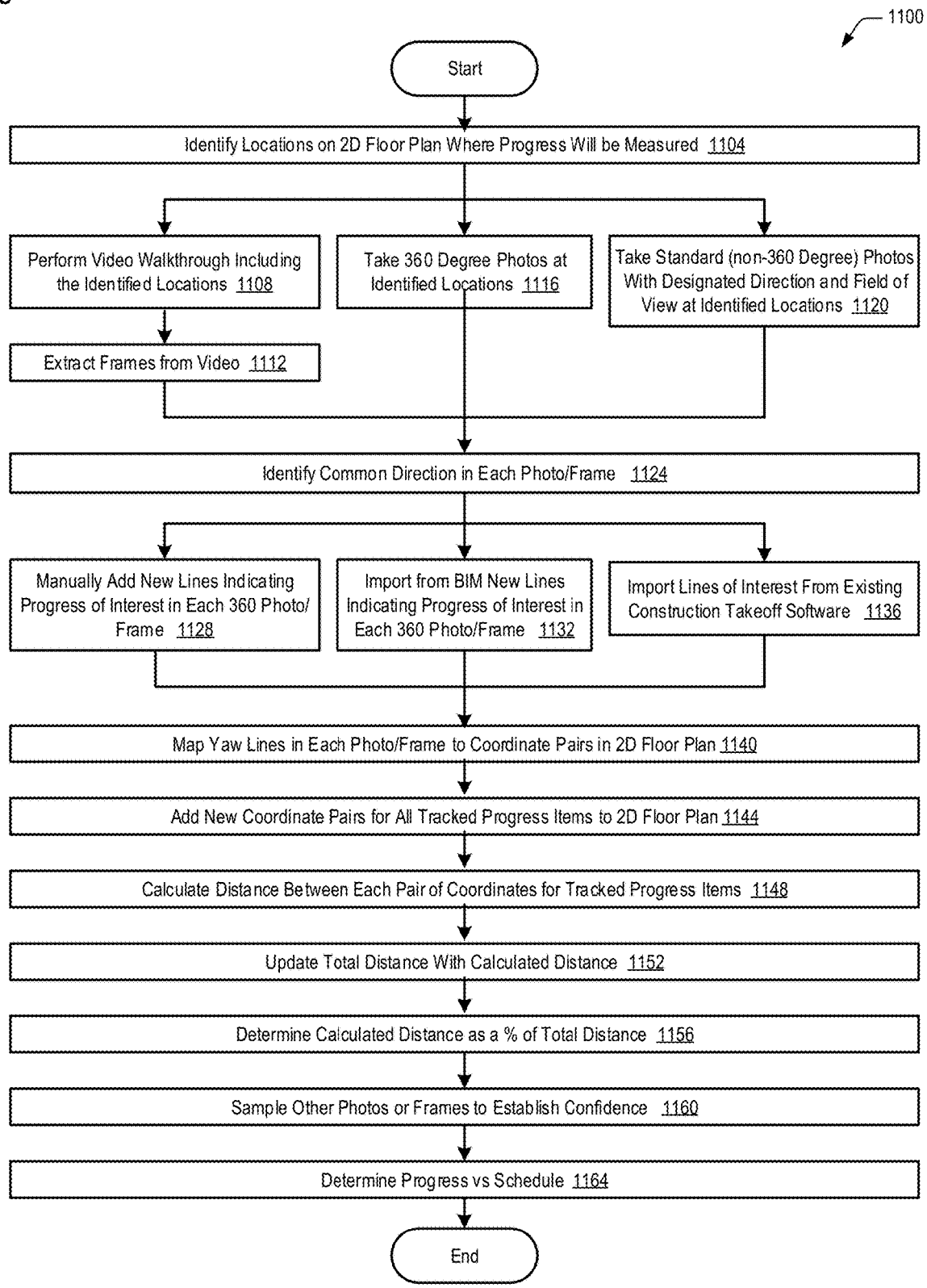

Fig. 12 Map Yaw Lines to 2D Coordinates
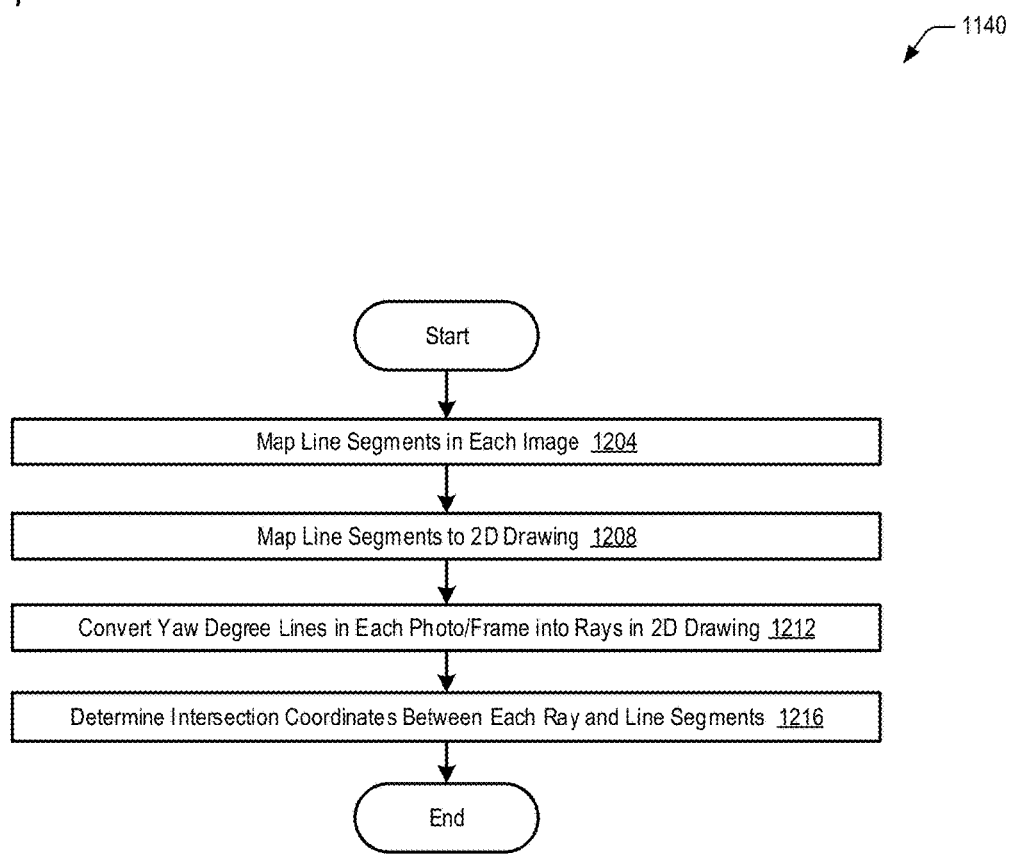

Fig. 13A Exterior Photo/Frame Before Segmentation
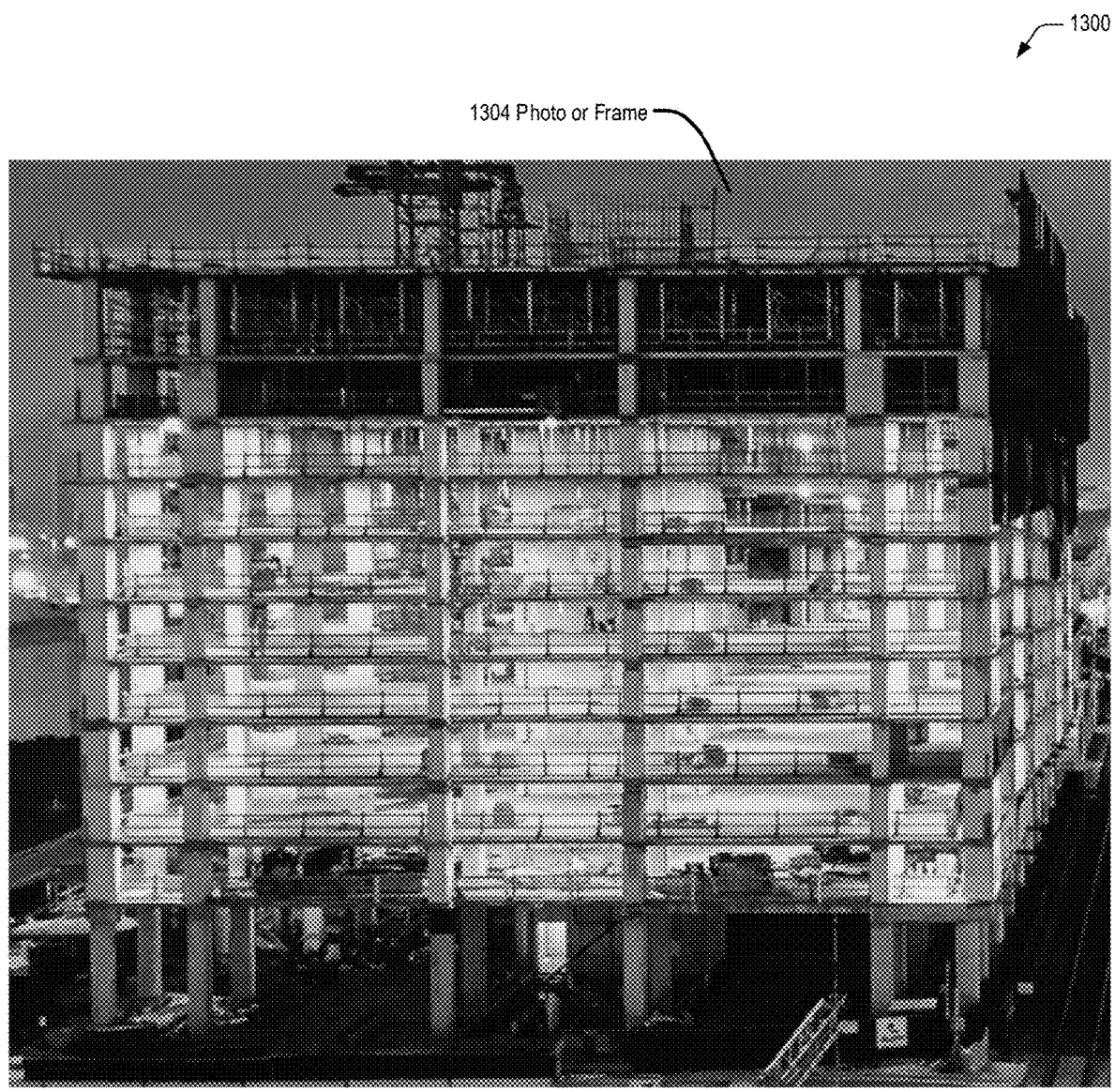

Fig. 13B  Segmented Area Within Photo/Frame
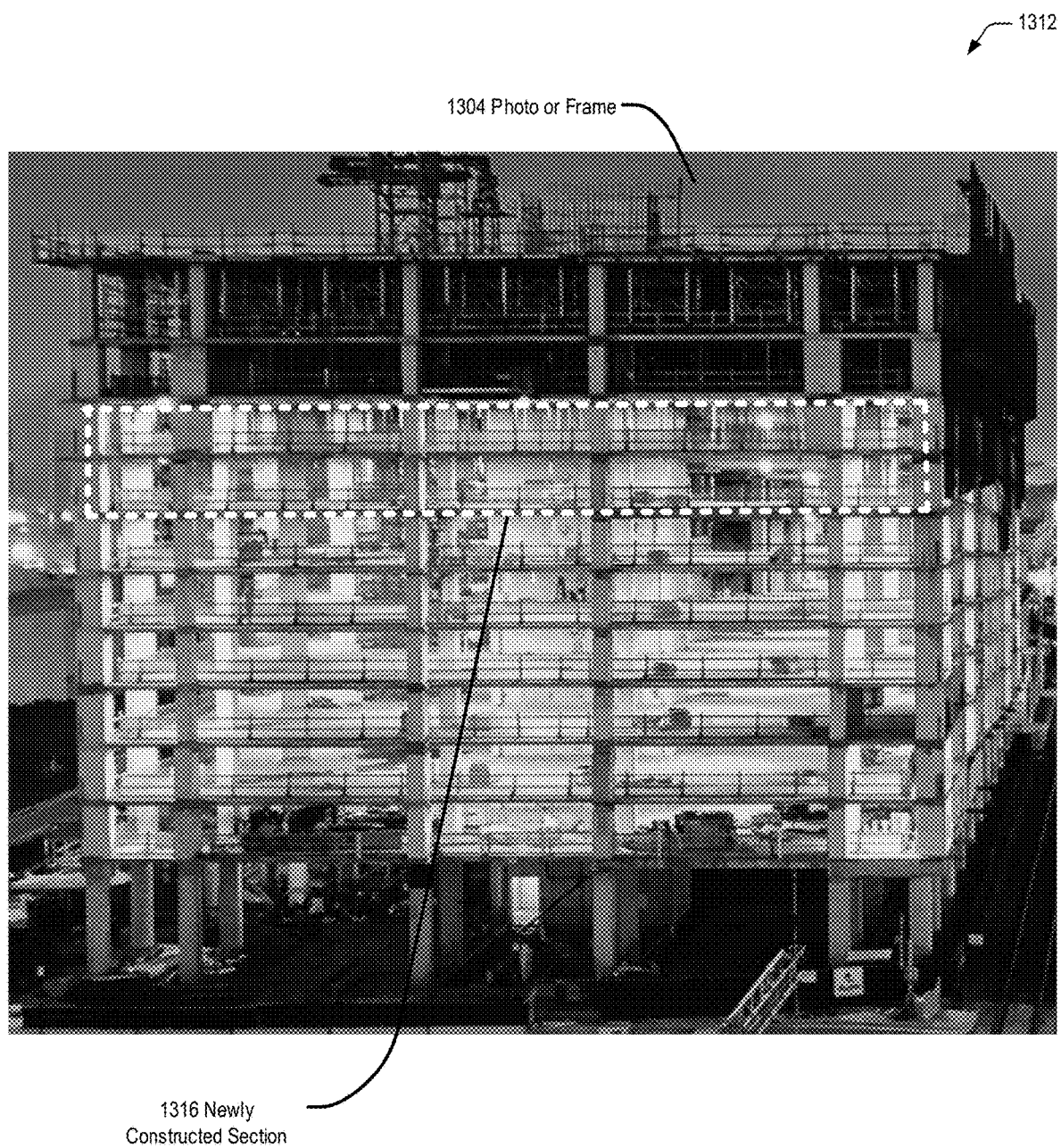

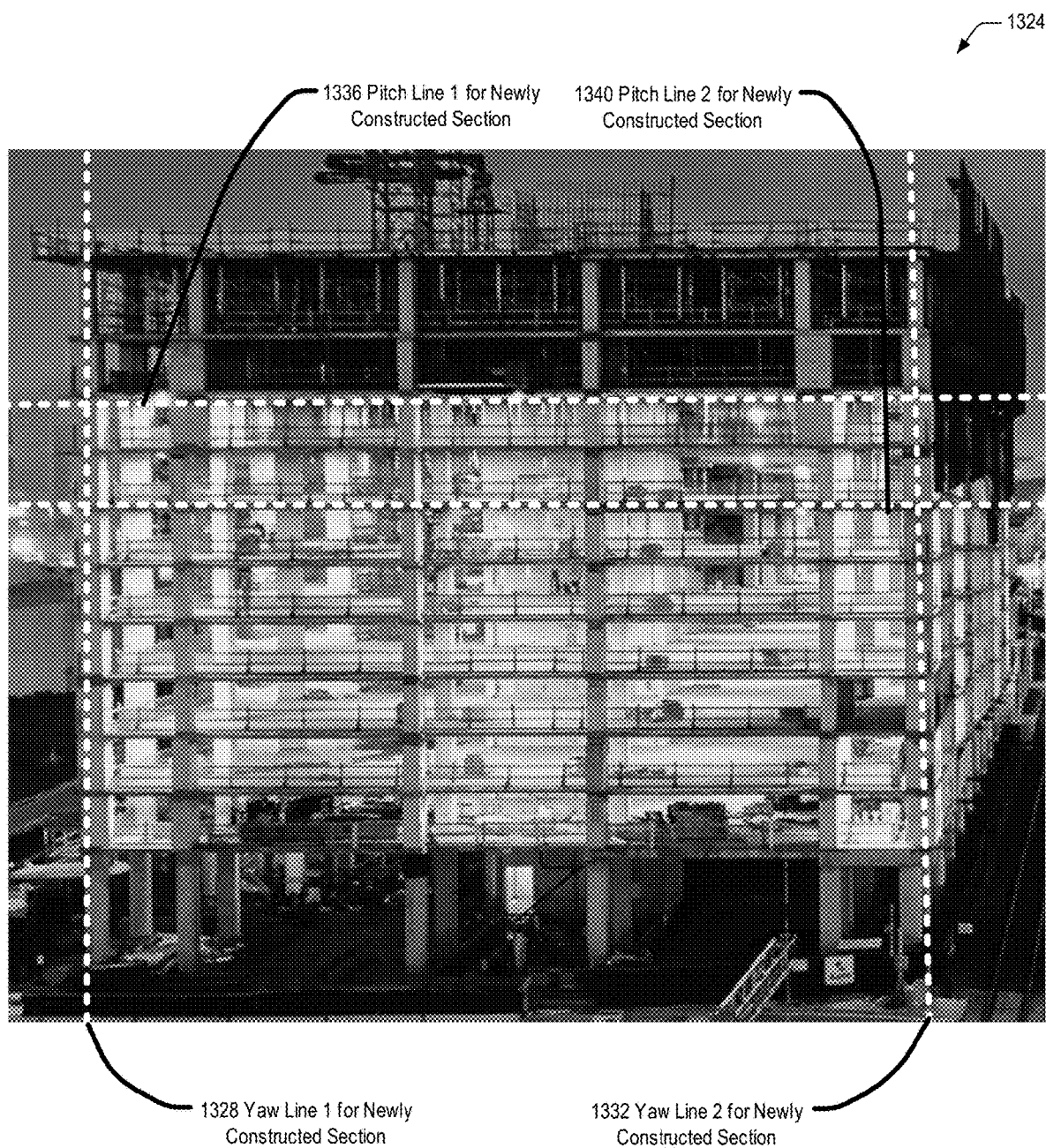
Fig. 13C Yaw and Pitch Line Pairs Within Photo/Frame

IMAGERY-BASED CONSTRUCTION PROGRESS TRACKING

CROSS REFERENCE TO RELATED APPLICATION(S)

This application is a continuation of application Ser. No. 16/509,340, filed Jul. 11, 2019, which claims the benefit of U.S. Provisional Application No. 62/697,472 filed Jul. 13, 2018 and entitled "PANORAMIC PROGRESS TRACKING METHOD", the entire contents of which are hereby incorporated by reference.

FIELD

The present invention is directed to methods and systems for progress tracking for building construction sites, using either conventional or panoramic imaging.

BACKGROUND 360 degree images, also known as immersive images or spherical images, are images where a view in every direction is recorded at the same time, shot using an omnidirectional camera or a collection of cameras. During photo viewing on normal flat displays, the viewer has control of the viewing direction and field of view. It can also be played on displays or projectors arranged in a cylinder or some part of a sphere. 360 degree photos are typically recorded using either a special rig of multiple cameras, or using a dedicated camera that contains multiple camera lenses embedded into the device, and filming overlapping angles simultaneously. Through a method known as photo stitching, this separate footage is merged into one spherical photographic piece, and the color and contrast of each shot is calibrated to be consistent with the others. This process is done either by the camera itself, or using specialized photo editing software that can analyze common visuals and audio to synchronize and link the different camera feeds together. Generally, the only area that cannot be viewed is the view toward the camera support.

360 degree images are typically formatted in an equirectangular projection. There have also been handheld dual lens cameras such as Ricoh Theta V, Samsung Gear 360, Garmin VIRB 360, and the Kogeto Dot 360—a panoramic camera lens accessory developed for various models of smartphones.

360 degree images are typically viewed via personal computers, mobile devices including smartphones, or dedicated head-mounted displays. Users may pan around the video by clicking and dragging. On smartphones, internal sensors such as gyroscopes may also be used to pan the video based on the orientation of the mobile device. Taking advantage of this behavior, stereoscope-style enclosures for smartphones (such as Google Cardboard viewers and the Samsung Gear VR) can be used to view 360 degree images in an immersive format similar to virtual reality. A smartphone display may be viewed through lenses contained within the enclosure, as opposed to virtual reality headsets that contain their own dedicated displays.

SUMMARY

The present invention is directed to solving disadvantages of the prior art. In accordance with embodiments of the present invention, a method is provided. The method includes one or more of receiving, by an image processing device, one or more images from an image capture device. The one or more images are each associated with metadata that includes a common direction. For each of the one or more images, the method further includes adding one or more pairs of parallel lines, converting each of the one or more pairs of parallel lines into intersection coordinates with 2D drawing elements, and calculating construction progress from the intersection coordinates. The 2D drawing includes a 2D floor plan or a 2D elevation plan, and each pair of parallel lines designates one of the start or end of construction during a current period of time.

In accordance with another embodiment of the present invention, an image processing device is provided. The image processing device includes a memory and a processor, coupled to the memory. The memory includes one or more applications, a 2D drawing including building locations, and one or more images of the building locations. Each image is associated with metadata including a common direction. The processor is configured to execute the one or more applications to receive the one or more images from an image capture device, and for each of the one or more images add one or more pairs of parallel lines, convert each of the one or more pairs of parallel lines into intersection coordinates with 2D drawing elements, and calculate construction progress from the intersection coordinates. The 2D drawing includes a 2D floor plan or a 2D elevation plan, and each pair of parallel lines designates one of the start or end of construction during a current period of time.

In accordance with yet another embodiment of the present invention, a non-transitory computer readable storage medium is provided. The non-transitory computer readable storage medium is configured to store instructions that when executed cause a processor to perform one or more of receiving, by an image processing device, one or more images from an image capture device. The one or more images are each associated with metadata that includes a common direction. For each of the one or more images, the method further includes adding one or more pairs of parallel lines, converting each of the one or more pairs of parallel lines into intersection coordinates with 2D drawing elements, and calculating construction progress from the intersection coordinates. The 2D drawing includes a 2D floor plan or a 2D elevation plan, and each pair of parallel lines designates one of the start or end of construction during a current period of time.

One advantage of the present invention is that it provides methods and systems for determining construction progress from a 360 or non-360 degree video or 360 or non-360 degree photos. Frames may be extracted from 360 or non-360 degree videos to serve as individual 360 or non-360 degree photos, respectively. A common reference direction is provided for each of the captured photos or frames, and a combination of videos/frames, 360 degree photos, and non-360 degree photos may be used to establish construction progress for a current sampling interval.

Another advantage of the present invention is that it provides methods and systems for leveraging machine vision and machine learning to establish and update building construction progress. From obtained images (videos/frames, 360 degree photos, and non-360 degree photos), yaw and/or pitch lines may be extracted that correspond to added construction elements. Positional coordinate information may be determined from the yaw/pitch lines, which then allows calculation of linear distance, % complete, and other metrics to establish or update construction progress.

Another advantage of the present invention is that it allows an individual not skilled in construction or project management to capture images using an image capture device. Interpretation of the images may be performed offline and remote to a building construction site by either a skilled construction professional or computing resources running progress determination software applications.

Additional features and advantages of embodiments of the present invention will become more readily apparent from the following description, particularly when taken together with the accompanying drawings. This overview is provided to introduce a selection of concepts in a simplified form that are further described below in the detailed description. It may be understood that this overview is not intended to identify key features or essential features of the claimed subject matter, nor is it intended to be used to limit the scope of the claimed subject matter.

BRIEF DESCRIPTION OF THE DRAWINGS

FIG. 1A is a diagram illustrating elements of a building location image capture environment in accordance with embodiments of the present invention.

FIG. 1B is a diagram illustrating elements of an image processing environment in accordance with embodiments of the present invention.

FIG. 2 is a block diagram illustrating an image processing device in accordance with embodiments of the present invention.

FIG. 3 is a diagram illustrating camera view orientation in accordance with embodiments of the present invention.

FIG. 4 is a diagram illustrating Image Locations on a 2D building floor plan in accordance with embodiments of the present invention.

FIG. 5A is a diagram illustrating image capture from a video walkthrough in accordance with embodiments of the present invention.

FIG. 5B is a diagram illustrating image capture from 360 degree photos in accordance with embodiments of the present invention.

FIG. 5C is a diagram illustrating image capture from non-360 degree photos in accordance with embodiments of the present invention.

FIG. 6A is a photo or frame illustrating added yaw lines in accordance with embodiments of the present invention.

FIG. 6B is a photo or frame prior to segmentation in accordance with embodiments of the present invention.

FIG. 6C is a photo or frame illustrating segmented areas in accordance with embodiments of the present invention.

FIG. 6D is a photo or frame illustrating added yaw and pitch line pairs in accordance with embodiments of the present invention.

FIG. 7 is a coordinate system for a 2D floor plan in accordance with embodiments of the present invention.

FIG. 8 is a diagram illustrating conversion of yaw lines to rays and rays to 2D floor plan coordinates in accordance with embodiments of the present invention.

FIG. 9 is a diagram illustrating linear distance determination from coordinates in accordance with embodiments of the present invention.

FIG. 10 is a flowchart illustrating a trigger process for progress measurement in accordance with embodiments of the present invention.

FIG. 11 is a flowchart illustrating an overall process flow in accordance with embodiments of the present invention.

FIG. 12 is a flowchart illustrating mapping yaw lines to 2D coordinates in accordance with embodiments of the present invention.

FIG. 13A is a photo or frame prior to segmentation in accordance with embodiments of the present invention.

FIG. 13B is a photo or frame illustrating a segmented area in accordance with embodiments of the present invention.

FIG. 13C is a photo or frame illustrating added yaw and pitch line pairs in accordance with embodiments of the present invention.

DETAILED DESCRIPTION

The present application utilizes various technologies to allow construction progress tracking using building 2-dimensional (2D) floor plans. Annotations may be associated with images at specific locations that correspond to building coordinates. The annotations allow for quick and automated calculation of construction progress at designated intervals. These comparisons may be performed anywhere and not necessarily in proximity to the building itself.

Prior to the present application, people needing to monitor building construction would generally walk around the building and take note of current construction compared to building construction plans at the building location or building site. In some cases, this might require an individual to carry some or all of paper construction plans to various points in the building in order to make an informed comparison. Such comparisons were inherently "local" by nature and required the individual with construction expertise (construction manager, foreman, supervisor, building inspector, etc) to be physically on-site in order to conduct the review and analysis.

Increasingly, the modern world is "paperless" and various forms of computers and computer networks interoperate to obtain data, store data, analyze data, and communicate data. The data may be text, graphics, video, audio, or any combination of data from any data sources. The present application describes methods and systems to perform universal (i.e. from literally anywhere, by any number of people) construction monitoring and management. This eliminates the requirements for many construction experts to be physically on-site frequently, which potentially may reduce construction costs and also allows construction problems to be identified and alleviated more quickly than conventional processes.

Referring now to FIG. 1, a diagram illustrating elements of a building location image capture environment 100 in accordance with embodiments of the present invention is shown. FIG. 1 illustrates an interior building location 104 that is a construction site in the preferred embodiment. A construction site may include a building location 104 in a state of redesign, remodel, assembly, or construction—using various types, quantities, and locations of building materials, tools, construction refuse or debris, and so forth.

FIG. 1 illustrates a representative partially-completed interior building location 100, with various tools, building refuse, and building materials scattered or arranged within. The building location 104 undergoes construction over a construction time period. The construction is based upon a construction schedule, and includes all types of construction or construction elements such as foundation, walls, ceilings, framing, support structures, electrical, plumbing, heating and air conditioning, windows and doors, concrete, fire protection, mechanical, drywall, and texturing/painting. Each of these elements of construction proceeds according to its own schedule, and in accordance with a master schedule for the building at large. In order to understand when the construction will be completed and the building may be ready to occupy, it is important to have regular measurement of overall building construction progress as well as progress for each construction sub-type.

Historically, tracking the construction progress at jobsites has been a manual and laborious process. The process typically requires a project engineer walking out to the jobsite with a floor plan of the project, and using a highlighter to mark walls, ducts, or rooms to track construction progress on a trade-by-trade manner. This must be done regularly and repeatedly for both the overall jobsite as well as for each trade.

The present application provides a solution to the time and effort required to regularly track construction progress by capturing jobsite video or photo images 112. The images 112 may be extracted from video taken during a building walkthrough, provided as 360 degree photos from a 360 degree camera, or provided as non-360 degree photos from a non-360 degree camera. An individual—either an image capture device operator or another individual—may track installed progress by selecting parts of a image reflecting recent construction. Application software may map the selected parts to one or more 2D drawings of the building and save significant time. Data collected by the process of selecting parts of an image that indicate construction progress may be leveraged with machine learning technology to automate the detection and tracking of installed components, further streamlining the process and saving time.

The building location image capture system 100 may include one or more image capture devices 108, which may be video or still cameras (i.e. photos) and either 360 degree or non-360 degree image capture devices 108. Non-360 degree image capture devices 108 include phones or tablets that may include a camera or digital camera with a given field of view that is less than 360 degrees. In one embodiment, 360 degree image capture devices 108 include 360 degree cameras. In another embodiment, 360 degree image capture devices 108 include 360 degree laser scanners with photo export capability. Image capture devices 108 capture images 112 based on specific image capture device positions 116 (i.e. what is visible at those positions 116), and for non-360 degree video cameras or still cameras 108, the direction the camera 108 is oriented towards and the field of view. The image illustrated in FIG. 1 corresponds to image position #1 412 of the building 2D floor plan 400 shown in FIG. 4.

Positions 116 may be determined by various means, including but not limited to receiving user inputs designating position coordinates, determining position coordinates based on recent/current/upcoming events in a construction schedule, determining position coordinates that use one or more of global positioning system coordinates, wireless connection coordinates, compass inputs, accelerometer inputs, or gyroscope inputs, receiving computer vision inputs that designate position coordinates, and receiving photogrammetry inputs that designate position coordinates.

Although the building location 104 is represented throughout the drawings herein as a non-panoramic image for simplicity and ease of understanding, it should be understood that captured 360 degree images 112 may include true 360-degree images with image content at all 360 degrees around the 360 degree image capture device 108 position (i.e. all 360 degrees of yaw 336 as shown in FIG. 3).

Referring now to FIG. 1B, a diagram illustrating elements of an image processing environment 120 in accordance with embodiments of the present invention is shown. The image capture device 108 transfers videos or photos 128 including captured images 112 to one or more image processing devices 124, which processes the videos or photos 128 according to the steps and processes described herein. The captured images 112 may be transmitted to image processing devices 124 over a conventional data or video cable, a wireless interface such as Bluetooth, WLAN, or WiFi connection, or through a transported storage device such as a thumbdrive or SD card.

One type of image processing device 124 may be suitable for processing only certain types of captured images 112, while other types of image processing device 124 may be suitable for processing all types of captured images 112—perhaps due to increased memory to store larger captured images (e.g. a video) or a larger display screen to display a larger captured image 112. Image processing devices 124 may include any type of computing device and are described in more detail with respect to FIG. 2. Image processing devices 124 receive captured images 112 from image capture devices 108, and may store captured images locally, remotely, in a storage cloud, or in any other storage location or combination of storage locations.

Referring now to FIG. 2, a block diagram illustrating an image processing device 124 in accordance with embodiments of the present invention is shown. The image processing device 200 may be any type of computing device including a server, a desktop computer, smart phone, a tablet, a pad computer, a laptop computer, a notebook computer, a wearable computer such as a watch, or any other type of computer.

The image processing device 200 includes one or more processors 204, which run an operating system and one or more applications 216, and control operation of the image processing device 124. The processor 204 may include any type of processor known in the art, including embedded CPUs, RISC CPUs, Intel or Apple-compatible CPUs, and may include any combination of hardware and software. Processor 204 may include several devices including field-programmable gate arrays (FPGAs), memory controllers, North Bridge devices, and/or South Bridge devices. Although in most embodiments, processor 204 fetches application 216 program instructions and metadata 212 from memory 208, it should be understood that processor 204 and applications 216 may be configured in any allowable hardware/software configuration, including pure hardware configurations implemented in ASIC or FPGA forms.

The image processing device 124 may include a display 228, which may include control and non-control areas. In some embodiments, controls are "soft controls" shown on the display 228 and not necessarily hardware controls or buttons on image processing device 124. In other embodiments, controls may be all hardware controls or buttons or a mix of "soft controls" and hardware controls. Controls may include a keyboard 232, or a keyboard 232 may be separate from the display 228. The display 228 may display any combination of photos, video, snapshots, drawings, text, icons, and bitmaps.

Image processing device 124 may include memory 208, which may include one or both of volatile and nonvolatile memory types. In some embodiments, the memory 208 may includes firmware which includes program instructions that processor 204 fetches and executes, including program instructions for the processes disclosed herein. Examples of non-volatile memory 208 may include, but are not limited to, flash memory, SD, Erasable Programmable Read Only Memory (EPROM), Electrically Erasable Programmable Read Only Memory (EEPROM), hard disks, and Non-Volatile Read-Only Memory (NOVRAM). Volatile memory 208 may store various data structures and user data.

Examples of volatile memory 208 may include, but are not limited to, Static Random Access Memory (SRAM), Dual Data Rate Random Access Memory (DDR RAM), Dual Data Rate 2 Random Access Memory (DDR2 RAM), Dual Data Rate 3 Random Access Memory (DDR3 RAM), Zero Capacitor Random Access Memory (Z-RAM), Twin-Transistor Random Access Memory (TTRAM), Asynchronous Random Access Memory (A-RAM), ETA Random Access Memory (ETA RAM), and all other forms of temporary memory.

In addition to metadata 212 and one or more application (s) 216, memory 208 may also include one or more captured images 112, including captured images 112 received from non-360 degree image capture devices 108 and/or 360 degree image capture devices 108. Memory 208 may also include one or more 2D floor plans or 2D elevation plans 220. The 2D floor plans or 2D elevation plans 220 may be of one building, multiple buildings, one building location 104, multiple building locations 104, one floor or other portions of a building, or multiple floors or portions of a building. 2D floor plans or 2D elevation plans 220 may include one or more floors or sections of a building 104 in plan view (i.e. top-down) as well as elevation view (i.e. from the side). Metadata 212 may include various data structures in support of the operating system and applications 216, such as timestamps associates with captured images 112, position coordinates 116 associated with each captured image 112, the type of captured image 112 (i.e. a 360 degree video, a non-360 degree video, a frame extracted from a 360 or non-360 degree video, a 360 degree photo, or a non-360 degree photo), and a common direction 416. Applications 216 may include one or more 2D construction applications and one or more 3D model programs. In addition to creating or displaying 2D floor plans 400 or 2D elevations (not shown), these applications 216 may allow various annotation data to be added to captured images 112—including yaw line 608, 612 and/or pitch lines 652, 656.

Image processing device 124 also includes one or more communication interfaces 224, which is any wired or wireless interface 224 able to connect to networks or clouds—including the internet, in order to transmit and receive captured images 112 or 2D floor plans or 2D elevation plans 220.

In some embodiments, image processing device 124 may optionally include an image capture device 108, which may produce a live camera image 240 or captures photographs used by one or more applications 216 and shown on display 228. A camera 108 may be either a 360 degree or panoramic camera 108, or a non-panoramic device 108. In some embodiments, the image processing device 124 may include both a front camera 108A as well as a rear camera 108B as well as a means to switch the camera image 112 between the front camera 108A and the rear camera 108B. In other embodiments, the image processing device 124 may not itself include a camera 108, but is able to interface with a separate camera through various means known in the art. In some embodiments, the image processing device 124 may be the same physical device as either the non-360 degree image capture device 108 or a 360 degree image capture device 108.

In some embodiments, the image processing device 124 may include a location tracking receiver 244, which may interface with GPS satellites in orbit around the earth or indoor positioning systems to determine accurate location of the image processing device 124. The location tracking receiver 244 may produce location coordinates 248 used by an operating system or application 216 to determine, record, and possibly display the image processing device 124 position or location.

Referring now to FIG. 3, a diagram illustrating camera view orientation in accordance with embodiments of the present invention is shown. FIG. 3 illustrates various camera orientations relative to x, y, and z dimensions. The x dimension may be viewed as left 316 to right 312. The y dimension may be viewed as up 320 to down 324. The z dimension may be viewed as front 304 to rear 308.

Each dimension may also have a rotation about one of the three axes (x, y, and z). A rotation around the x dimension (left-right axis) is pitch 332, and from a camera position at the center of the diagram is viewed as up or down motion. A rotation around the y dimension (up-down axis) is yaw 336, and from a camera position at the center of the diagram is viewed as left or right motion. A rotation around the z dimension (front-rear axis) is roll 328, and from a camera position at the center of the diagram is viewed as tilting left or right motion.

When specifying a specific camera or image capture device 108 view, it is important to specify several parameters. First, the image capture device position 116 (used for both non-360 and 360 degree devices) specifies a specific position or location 404 in proximity to the building location 104 (see FIG. 4). The specific position 404 includes an X and a Y value, and may be an interior or exterior position or location. The yaw 336 values and pitch 332 values described herein refer to photo or frame references made by a user or determined by other means.

One other parameter may need to be provided as metadata 212 associated with a specific photo or image 112 in order to fully specify a non-360 degree camera view: field of view. The camera or other image capture device 108 has a lens which may or may not be adjustable. The field of view is a standard measurement (i.e. a 360 field of view of a 360 degree image capture device 108, a 90 degree field of view from a non-360 degree image capture device 116, etc.).

Referring now to FIG. 4, a diagram illustrating image locations on a 2D building floor plan 400 in accordance with embodiments of the present invention is shown. FIG. 4 illustrates a 2D floor plan 400 for a building location 104 as shown in FIG. 1. The 2D building floor plan 400 views part of a building (i.e. a floor) from a top-down viewing perspective, and shows walls, windows, a doorway, and permanent structural columns.

The 2D floor plan 400, in the example illustrated, has eight locations where progress will be measured 404, identified as circled "1" through circled "8". Any specific location associated with the 2D floor plan 400 (i.e. a camera viewing location 116/404) has both an X and a Y coordinate 408. The X coordinate corresponds to a left-right position on the viewed 2D floor plan 400, and the Y coordinate corresponds to a top-bottom position on the viewed 2D floor plan 400. Thus, an X-Y coordinate pair 408 specifies a specific position 116 or location 404 on the 2D floor plan 400. Image position #1 412 corresponds to an entry door position of the building location 104, and is reflected in the building location 104 view shown in FIG. 1.

Although a camera position 116 in most embodiments has a height coordinate (Z coordinate) as well as X and Y coordinates 408, on a 2D floor plan 400 only the X and Y coordinates 408 are required since the Z coordinate is masked and does not change or affect the X or Y coordinates 408. In most embodiments, the Z coordinate (if specified) is the height above the floor of 2D floor plan 400 and building location 104 being viewed. In some embodiments, if a Z coordinate is not specified it is assumed to be at a fixed level. In one embodiment, the fixed level is a common eye level above the floor, for example 5.5-6.0 feet.

In an alternative embodiment, instead of a 2D floor plan 400 with a "looking down" perspective, an elevation construction drawing may provide a "side view" such as an exterior plan providing a view from the East, West, or other similar side perspective. In this case, matching pitch lines (in addition to yaw lines) may be utilized and mapped to the X-Z plane direction (assuming Z is "up"), For the purpose of the present application, a common direction 416 in terms of yaw 336 is defined. In the preferred embodiment, the common direction 416 may have a North orientation since some devices 108 may provide this information as part of captured image metadata 212. However, in other embodiments the common direction 416 may be different, and may include an axis of the building or building location 104 itself (such as, for example, the top windows in the 2D floor plan 400 being at a zero degree orientation from image position 1 412). In the example illustrated, the common direction 416 is North, as shown, where North is oriented toward the upper right of building location 104.

The present application also describes embodiments where construction progress may also be determined relative to pitch 332 (i.e. up-down). For those embodiments where pitch 332 values are used, the common pitch direction (not shown) most of the time reflects zero degrees or an unpitched value. In other embodiments, the common direction in terms of pitch 332 may reflect a different reference direction than zero degrees or unpitched.

The image capture device 108 captures images 112 at one or more image capture device positions 116 associated with a building or building location 104. The building location 104 may be a complete building interior, a floor of a building, or a portion of a floor or building. Once positioned at the one or more image capture device positions 116, 404, one or more images 112 are captured. In one embodiment, the captured images 112 may be stored as a file in a memory device of the image capture device 108, such as an SD Card or USB memory. In another embodiment, the image capture device 108 may include a wired or wireless interface that transfers the captured images 112 to another location such as a server or mobile device serving as an image processing device 124. In yet another embodiment, the image capture device 108 includes a wired or wireless interface that transfers the captured images 112 to cloud storage or another storage medium, and sent to or retrieved by the image processing device 124.

A single image 112 or multiple images 112 may be captured, and may be captured at different positions 116 or locations 404. A given set of captured images 112 may include images from both non-360 degree image capture devices and 360 degree image capture devices 108. A given set of captured images 112 may include images captured at different times, and one or more captured images 112 may include associated metadata 212 as previously described.

Referring now to FIG. 5A, a diagram illustrating image capture from a video walkthrough 500 in accordance with embodiments of the present invention is shown. FIG. 5A illustrates image capture for a building 104 based on a video walkthrough performed along a video walkthrough path 504. The video may be either a 360 or non-360 degree video. A 360 or non-360 degree video camera is a type of image capture device 108, and captures video of all points during the walkthrough. The only requirement for image capture based on 360 or non-360 degree video is the walkthrough must include all of the locations where progress will be measured 404. Therefore, these locations 404 are generally defined prior to a first video walkthrough. Alternately, a video walkthrough may be performed prior to defining the locations where progress will be measured 404, and the locations 404 may instead correspond to captured frames within the 360 or non-360 degree video. This embodiment may be helpful if the video walkthrough path 504 is comprehensive and includes all locations of interest at the building or building location 104. Once the video walkthrough is completed, frames at each image location 508 are extracted from the video. Each frame thus serves as a 360 or non-360 degree photo at each location of interest 404. In one embodiment, a video walkthrough may be performed by a robot or drone that traverses the video walkthrough path 504. For non-360 degree videos, each extracted frame (i.e. a non-360 degree photo) must have associated with it a direction and field of view.

Referring now to FIG. 5B, a diagram illustrating image capture from 360 degree photos 520 in accordance with embodiments of the present invention is shown. FIG. 5B illustrates image capture for a building 104 based on a 360 degree photos taken at each location of interest 404. A 360 degree camera is a type of image capture device 108, and captures photos at all azimuth points at individual locations 524. Because a 360 degree camera only captures discrete images, in most embodiments the desired image locations 524 may be defined prior to capturing 360 degree photos. The 360 degree photo locations 524 correspond to locations where progress will be measured 404. Although all images 520 have a 360 degree field of view, they still have a common reference direction 416 associated with each 360 degree photo 520, so they can all be referencing the same direction 416.

Referring now to FIG. 5C, a diagram illustrating image capture from non-360 degree photos 540 in accordance with embodiments of the present invention is shown. FIG. 5C illustrates image capture for a building 104 based on non-360 degree photos taken at each location of interest 548. Non-360 degree photos may be taken by conventional non-360 degree cameras or most smart phones. A non-360 degree camera is a type of image capture device 108, and captures photos in a specific direction and with a specific field of view. Thus, each non-360 degree photo may be associated with a designated direction and field of view 544. The designated direction may be coincidentally the same as the common direction 416, but only if the construction work of interest happens to coincide with the common direction 416. Because a non-360 degree camera only captures discrete images, in most embodiments the desired image locations 548 are defined prior to capturing non-360 degree photos. The 360 degree photo locations 548 correspond to locations where progress will be measured 404.

Although FIGS. 5A-5C generally assume that all captured images 112 for a building or building location 104 are captured the same way (i.e. using a video walkthrough and frame extraction of FIG. 5A, 360 degree photos of FIG. 5B, or non-360 degree photos of FIG. 5C), it should be understood that different image capture techniques 500, 520, 540 may be combined for different locations 404 of the building or building location 104. That is, a video walkthrough 500 may be used for a first part of a building 104, one or more 360 degree photos 520 may be used for a second part of the building 104, and one or more non-360 degree photos 540 may be used for a third part of the building 104. This may have the advantage of allowing different individuals with different equipment and/or availability to capture images 112 of the building 104. Naturally, this may result in somewhat different processing for the captured images 112 because of the need to extract frames from videos or specify direction and field of view for non-360 degree photos.

Referring now to FIG. 6A, a photo or frame 600 illustrating added yaw lines in accordance with embodiments of the present invention is shown. FIG. 6 illustrates an exemplary photo or frame 604 of viewing location #3 within building or building location 104. Because photo or frame 604 may only be shown as a non-360 degree photo, we assume for this example the capture device 108 is a conventional (i.e. non-360 degree) camera. As shown in FIG. 5C for capture location #3, the image capture direction is toward the left. Photo 600 therefore reflects various electrical and plumbing construction details at a point within the interior left side of building or building location 104. For the illustrated photo or frame 604, several possible objects of interest or construction elements are shown—various pipes (plumbing), electrical conduit and junction boxes, structural beams, lighting, and finished and unfinished walls.

For each captured photo or frame 604, it is required to add parallel yaw lines 608, 612 to designate construction progress for a type of construction element during a current sampling period or period of time. One line 608, 612 corresponds to the start of new construction, while the other line 608, 612 corresponds to the end of new construction. In one embodiment, the yaw line designating the start of new construction may be to the left of the yaw line designating the end of new construction, while in another embodiment, the yaw line designating the start of new construction may be to the right of the yaw line designating the end of new construction.

In the example photo or frame illustrated 604, there is a yaw line 608 at approximately 250 degrees to the common direction based on a common direction 416 of North as shown in FIG. 4. There is also a yaw line 612 at approximately 260 degrees to the common direction based on a common direction 416 of North as shown in FIG. 4. Selection of the illustrated yaw lines 608, 612 shown in photo or frame 604 may be appropriate for a section of painted wall, installation of four new pipes, or installation of a ceiling electrical junction box and associated electrical conduit.

In one embodiment, between the yaw lines 608, 612 a number of specific elements or portion(s) of specific elements may be determined or calculated. An "element" may be one entire line, but the yaw lines 608, 612 may extend to the middle of a line. In that case, it may include just a portion of that line, and not the entire line—therefore the calculation may count or determine not how many of a construction element are present, but instead a portion thereof (i.e. 50% of a line, ceiling, etc.).

Referring now to FIG. 6B, a photo or frame 620 prior to segmentation in accordance with embodiments of the present invention is shown. FIGS. 6B-6D illustrates an embodiment illustrating adding yaw or pitch lines based on segmentation. Although yaw or pitch lines may be directly added to a photo or frame 624, for certain construction elements it may be more efficient to first create segmentation and then add yaw or pitch lines that correspond to the segmentation. The photo 620 of FIG. 6B shows an interior building construction photo at the framing stage. In some locations, either drywall or other wall covering has already been applied. Steel and concrete structural supports are visible.

Referring now to FIG. 6C, a photo or frame 630 illustrating segmented areas in accordance with embodiments of the present invention is shown. The first step in creating segmentation is identifying construction elements within the photo or frame 630. In FIG. 6C, segmentation including two separate framed sections are shown, identified as framed section A 638A and framed section B 638B. Each of the framed sections 638A, 638B are shown with a horizontal arrowed line (yaw) and a vertical arrowed line (pitch). Thus, from the viewing location, each framed section 638A, 638B may be defined by a pair of yaw values (width) and a pair of pitch values (height). The boundaries or outline of each of the framed sections 638A, 638B include a number of line segments 634. Line segments 634 may be joined in order to identity an enclosed space defining an area of painting, framing, etc or defining an added construction element or elements (e.g. a pipe, group of pipes, circuit breaker box, etc). Joined line segments 634 may also define a voided area representing construction progress, such as a doorway created by removing material from a wall. In such a case, removed material may be considered a "construction object of interest" or a "construction element" in the context of the present application.

Referring now to FIG. 6D, a photo or frame 640 illustrating added yaw and pitch line pairs in accordance with embodiments of the present invention. Once each of framed sections 638A, 638B have been defined, a pair of yaw lines 644, 648 and a pair of pitch lines 652, 656 are added to define yaw and pitch boundaries for each framed section 638. Only yaw lines 644, 648 and pitch lines 652,656 for framed section A 638A are shown, in order to not clutter FIG. 6D. However, it should be understood that if both framing sections 638A and 638B are being tracked to provide a construction progress update, a second set of yaw lines and pitch lines (corresponding to framing section B 638B on the right side of the photo) would also be present. Each pair of yaw lines 644, 648 and pitch lines 652, 656 make up a parallel line pair 660.

In one embodiment, between the yaw lines 644, 648 or pitch lines 652, 656 a number of specific elements or portion(s) of specific elements may be determined or calculated. An "element" may be one entire line, but the yaw lines 644, 648 or pitch lines 652, 656 may extend to the middle of a line. In that case, it may include just a portion of that line, and not the entire line—therefore the calculation may count or determine not how many of a construction element are present, but instead a portion therof (i.e. 50% of a line, ceiling, etc.).

Referring now to FIG. 7, a coordinate system for a 2D floor plan 700 in accordance with embodiments of the present invention is shown. The coordinate system 700 is used to reference all photos or frames 604 for the building or building location. Each coordinate includes a coordinate pair of an X coordinate and a Y coordinate. The building location 104 includes an origin coordinate 704 and a second coordinate 708. In most embodiments, the origin coordinate 704 has (X,Y) coordinates of (0,0). However, on other embodiments the origin coordinate 704 may have a different (X,Y) coordinate than (0,0). The second coordinate 708 includes an ending (X,Y) coordinate that is generally the highest coordinate of the building or building location 104. In most embodiments, all locations of interest 404 have an (X,Y) coordinate at or between the origin coordinate 704 and the second coordinate 708. In some embodiments, all locations of interest 404 may be within the building or building location 104. In other embodiments, some locations of interest 404 may be within the building or building location 104 while other locations of interest 404 may be outside the building or building location 104. In yet other embodiments, all locations of interest 404 may be outside the building or building location 104. In some embodiments, the origin coordinate 704 may have an (X,Y) coordinate of (0,0), while the second coordinate 708 may have an (X,Y) coordinate of (1,1). All points between the origin coordinate 704 and the second coordinate 708 have (X,Y) coordinates extrapolated between the origin coordinate 704 and the second coordinate 708. Thus, for example, camera position #3 712 may have an (X,Y) coordinate of (0.18,0.58).

In the example of FIG. 7, an origin coordinate 704 having an X-Y coordinate pair of (0,0) is assigned outside the walls of building location 104 so that all interior building location positions to the left and bottom parts of the 2D floor plan may be used as potential camera positions 116. However, in other embodiments a more restrictive origin coordinate 704 may be selected in order to exclude portions of building location 104 as potential camera positions 116.

For the second coordinate 708 having an X-Y coordinate pair of (1,1) may also be assigned outside the walls of building location 104 so that all interior building location positions to the top and right parts of the 2D floor plan may be used as potential camera positions 116. By assigning X-Y coordinates of (0,0) for the origin coordinate 704 and (1,1) for the second coordinate 708, any potential camera position 116 within building location 104 will have an X coordinate between 0 and 1 and a Y coordinate between 0 and 1 (or an X-Y coordinate between (0,0) and (1,1)). With the origin 704 and second 708 coordinates defined, there is now a coordinate system 700 established for the 2D floor plan. Within the defined 2D coordinate system 700 (i.e. between (0,0) and (1,1)), one or more individuals or robots/drones may capture photos or frames at one or more specific camera positions 116. Each of these camera positions 116 has an X and a Y value.

Referring now to FIG. 8, a diagram illustrating conversion of yaw lines to rays and rays to 2D floor plan coordinates 800 in accordance with embodiments of the present invention is shown. FIG. 8 shows a 2D floor plan having a viewing position at camera position 3 712 and reflecting the view shown in FIG. 6A.

After providing yaw line 608 at 250 degrees to the common direction, a ray to the yaw line at 250 degrees 804 is extended from camera position 3 712 to the point on the wall that corresponds to yaw line 608. The 250 degree yaw line intersection converted to a 2D floor plan coordinate 808 produces an (X,Y) coordinate of (0.02, 0.57). Similarly, after providing yaw line 612 at 260 degrees to the common direction, a ray to the yaw line at 260 degrees 812 is extended from camera position 3 712 to the point on the wall that corresponds to yaw line 612. The 260 degree yaw line intersection converted to a 2D floor plan coordinate 816 produces an (X,Y) coordinate of (0.02, 0.64). Both coordinates 808, 816 are within the coordinate system 700 of (0,0) to (1,1) describes earlier.

Referring now to FIG. 9, a diagram illustrating linear distance determination from coordinates 900 in accordance with embodiments of the present invention is shown. FIG. 9 shows a 2D floor plan with coordinates (0.02, 0.57) and (0.02, 0.64) previously established as described with respect to FIG. 8. Once the coordinates 808, 816 are established, a linear distance between coordinates 904 may then be determined. In one embodiment, an application 216 determines the linear distance 904 by calculating the distance along line segments 634 between the two coordinates 808, 816. In another embodiment where the coordinates 808, 816 reflect only a single line segment 634 (as in FIG. 9, where the X values of 0.02 for both coordinates 808, 816 are the same), the linear distance may be determined by subtracting the Y values (0.64−0.57=0.07) and multiplying by a scaling factor between the coordinate system and the actual location. In this example, for a scaling factor of 100 from the coordinate system to the actual location, the linear distance 904 may be 0.07×100=7 feet.

Referring now to FIG. 10, a flowchart illustrating a trigger process for progress measurement 1000 in accordance with embodiments of the present invention is shown. The progress measurement process may be triggered in many different ways. For example, it may be triggered when a major construction milestone has been completed, when a related or unrelated financial milestone has occurred, or in response to detecting a change in a construction schedule. FIG. 10 shows a process flow based on an embodiment involving a measurement interval. A measurement interval is generally, but not necessarily, a fixed time period—such as daily, biweekly, weekly, monthly, etc.

At block 1004, a progress measurement interval is determined. In one embodiment, the measurement interval does not change for the duration of the project. In another embodiment, the measurement interval may change due to changing project parameters, priorities, or conditions. For example, if progress is falling behind schedule, the measurement interval may be reduced to introduce more frequent measurements to react faster to changes. For another example, if a project is getting further ahead of schedule, a measurement interval may be relaxed—reflecting less need for intensive project management. Flow proceeds to block 1008.

At block 1008, an initial progress measurement interval is begun. In one embodiment, the measurement interval may be of predetermined duration. In another embodiment, the measurement interval may be of a variable duration. Flow proceeds to block 1012.

At block 1012, construction progress is measured using the processes of the present application, for all locations 404 of interest. Flow proceeds to block 1016. At block 1016, after the construction progress has been measured, the construction progress is stored and/or reported. Flow proceeds to decision block 1020.

At decision block 1020, a determination is made as to whether a next measurement interval has been reached. If the next measurement interval has not been reached, then flow returns to decision block 1020 to continue to wait until the next measurement interval has been reached. If the next measurement interval has been reached, then flow proceeds to block 1012 to measure construction progress for the next measurement interval. In this way, a construction progress measurement is made for each measurement interval.

Referring now to FIG. 11, a flowchart illustrating an overall process flow 1100 in accordance with embodiments of the present invention is shown. FIG. 11 illustrates a process 1100 to annotate captured images with construction progress information, and from the annotated images calculate construction progress. Flow begins at block 1104.

At block 1104, locations in a 2D floor plan 400 are identified where construction progress will be measured 404. These locations 404 may in inside or outside, on multiple floors of a building 104, or in or around multiple buildings 104. Flow proceeds to blocks 1108, 1116, and 1120.

At block 1108, a video walkthrough is performed along a video walkthrough path 504, which includes the identified locations 404. The video includes a continuous series of frames 508 from a starting point to an ending point, where each frame is a 360 or non-360 degree photo. Flow proceeds to block 1112.

At block 1112, frames are extracted from the video 508. Each of the frames corresponds to one of the identified locations 404. In one embodiment, a user manually extracts one or more frames 508 while viewing the video. In another embodiment, a software application 216 extracts one or more frames 508 from the video. In one embodiment, a software application 216 extracts one or more frames 508 at an identified location 404 based on a timestamp of the one or more frames relative to one of the start or end of the video. In another embodiment, a software application 216 extracts one or more frames 508 at an identified location 404 based on an (X,Y) coordinate 408 of the one or more frames in proximity to an (X,Y) coordinate of an identified location 404. For non-360 degree videos, each extracted frame (i.e. a non-360 degree photo) must have associated with it a direction and field of view. Flow proceeds to block 1124.

At block 1116, one or more 360 degree photos 524 are taken at one or more identified locations 404. Each 360 degree photo 524 includes am image in all left-right directions (i.e. yaw 336), such that any such direction may be selected for viewing. Flow proceeds to block 1124.

At block 1120, one or more non-360 degree photos 548 are taken at one or more identified locations 404. Each non-360 degree photo 548 is captured in a designated direction and with a designated field of view. Flow proceeds to block 1124.

At block 1124, a common direction 416 is identified in each frame 508, 360 degree photo 524, or non-360 degree photo 548. The common direction 416 is any yaw value 336 or compass direction, and in the preferred embodiment is a North direction due to commonality in image capture devices 108 and application software 216. The common direction 416 may be stored in metadata 212 associated with each frame 508, 360 degree photo 524, or non-360 degree photo 548. Flow proceeds to blocks 1128, 1132, and 1136.

At block 1128, new yaw lines 644, 648 and/or pitch lines 652,656 are added to each frame 508, 360 degree photo 524, or non-360 degree photo 548. The new yaw lines 644, 648 and/or pitch lines 652,656 indicate progress of interest within the current interval or measurement event. In one embodiment, a given frame 508, 360 degree photo 524, or non-360 degree photo 548 includes only a single pair of new yaw lines 644, 648 or pitch lines 652,656 to indicate overall construction progress. In another embodiment, a given frame 508, 360 degree photo 524, or non-360 degree photo 548 includes multiple pairs of new yaw lines 644, 648 and/or pitch lines 652,656. In this embodiment, each pair of lines 644, 648 or 652,656 may indicate progress of a different type, for example, HVAC progress, drywall installation progress, plumbing installation progress, or any other form of construction progress. Thus, several unique progress measurements (i.e. 644A/648A, 644B/648B, 644C/648C, etc) may be obtained for a particular frame 508, 360 degree photo 524, or non-360 degree photo 548. Flow proceeds to block 1140.

At block 1132, new lines 644, 648 and/or 652,656 are imported from a building information model (BIM) and added to each frame 508, 360 degree photo 524, or non-360 degree photo 548. Building information modeling (BIM) is a process supported by various tools and technologies involving the generation and management of digital representations of physical and functional characteristics of places. Building information models (BIMs) include files (often but not always in proprietary formats and containing proprietary data) which can be extracted, exchanged or networked to support decision-making regarding a built or constructed asset. Current BIM software is used by individuals, businesses and government agencies who plan, design, construct, operate and maintain diverse physical infrastructures. The new lines 644, 648 and/or 652,656 indicate progress of interest within the current interval or measurement event. In one embodiment, a given frame 508, 360 degree photo 524, or non-360 degree photo 548 includes only a single pair of new lines 644, 648 and/or 652,656 to indicate overall construction progress. In another embodiment, a given frame 508, 360 degree photo 524, or non-360 degree photo 548 includes multiple pairs of new lines 644, 648 and/or 652,656. In this embodiment, each pair of lines 644, 648 and/or 652,656 may indicate progress of a different type, for example, HVAC progress, drywall installation progress, plumbing installation progress, or any other form of construction progress. Thus, several unique progress measurements (i.e. 644A/648A, 644B/648B, 644C/648C, etc) may be obtained for a particular frame 508, 360 degree photo 524, or non-360 degree photo 548. Flow proceeds to block 1140.

At block 1136, new lines 644, 648 and/or 652,656 are imported from existing construction takeoff software and added to each frame 508, 360 degree photo 524, or non-360 degree photo 548. Takeoff software, or construction cost estimating software, is computer software designed for contractors to estimate construction costs for a specific project. A cost estimator will typically use estimating software to estimate their bid price for a project, which will ultimately become part of a resulting construction contract. Some architects, engineers, construction managers, and others may also use cost estimating software to prepare cost estimates for purposes other than bidding. The new lines 644, 648 and/or 652,656 indicate progress of interest within the current measurement interval or measurement event. In one embodiment, a given frame 508, 360 degree photo 524, or non-360 degree photo 548 includes only a single pair of new lines 644, 648 or 652,656 to indicate overall construction progress. In another embodiment, a given frame 508, 360 degree photo 524, or non-360 degree photo 548 includes multiple pairs of new lines 644, 648 and/or 652,656. In this embodiment, each pair of lines 644, 648 or 652,656 may indicate progress of a different type, for example, HVAC progress, drywall installation progress, plumbing installation progress, or any other form of construction progress. Thus, several unique progress measurements (i.e. 644A/648A, 644B/648B, 644C/648C, etc) may be obtained for a particular frame 508, 360 degree photo 524, or non-360 degree photo 548. Flow proceeds to block 1140.

At block 1140, the new lines 644, 648 and/or 652,656 in each frame 508, 360 degree photo 524, or non-360 degree photo 548 are mapped to coordinate pairs in the 2D floor plan 400. First, each yaw line 644, 648 and/or 652,656 is represented as a ray 804, 812 in the 2D floor plan. The origin of each ray 804, 812 is a camera position, such as camera position 3 712—which has a corresponding (X,Y) coordinate such as (0.18, 0.58) for camera position 3 712 in FIGS. 7 and 8. Each ray 804, 812 proceeds outward from a camera position and intersects a wall of the building 104 at some point. In some cases, a ray 804, 812 may intersect multiple walls of the same building 104. However, in most cases only the first such wall intersection is of interest.

Various methods exist to identify the (X,Y) coordinates where a ray 804, 812 intersects a wall. For example one method identifies if a ray with origin o and direction d intersects a line segment with end points a and b. This problem may be converted into a ray-ray intersection problem if one turns the line segment into a ray with origin a and direction b. Checking if two things intersect involves finding out if they share at least one common point. The first step is to express the ray and the line segment as sets of points. In parametric form, the ray becomes:

$$x_1(t_1)=0+d_{t1} \text{ for } t_1 \in [0,\infty]$$

The line segment on the other hand is:

$$x_2(t_2)=a+(b-a)t_2 \text{ for } t_2 \in [0,1]$$

Next, the two equations are set to be equal $x_1(t_1)=x_2(t_2)$ and the values of $t_1$ and $t_2$ are found. Since there are two dimensions the equality can be split into the x and y counterparts and yield two equations to solve for the two unknowns. Once $t_1$ and $t_2$ are calculated, the ray and the segment intersect if $t_1 \geq 0$ and $0 \leq t_2 \leq 1$. Under these conditions, the point of intersection is on both the ray and the line segment.

The solution simplifies very neatly following some substitutions. Let $v_1=o-a$, $v_2=b-a$ and $v_3=(-d_y, d_x)$. Intuitively, $v_3$ is just the direction perpendicular to d. The result is then expressed as:

$$t_1=|v_2 v_1|/(v_2 * v_3) \text{ and } t_2=(v_1 * v_3)/(v_2 * v_3)$$

With the intersection coordinates now determined, flow proceeds to block 1144.

At block 1144, the new (X,Y) coordinate pairs 808, 816 determined for all rays 804, 812 are added to the 2D floor plan. One or more (X,Y) coordinate pairs 808, 816 may be associated with an identification of what specific construction is being tracked. For example, associated with a coordinate pair (0.02, 0.57) and (0.02, 0.64) may be an identification "new pipes added on <date>", where <date> may be the calendar date when the measurement progress was captured or determined, a line identifier in a schedule, or some other date. Flow proceeds to block 1148.

At block 1148, a distance between each pair of related coordinates being tracked is calculated, using the 2D floor plan. For example, FIG. 6 illustrates a construction photo 600 having a left yaw line 608 at 250 degrees relative to North 416 and a right yaw line 612 at 260 degrees relative to North 416. The left yaw line 608 corresponds to ray 804 at 250 degrees and (X,Y) coordinate 808 (0.02, 0.57). The right yaw line 612 corresponds to ray 812 at 260 degrees and (X,Y) coordinate 816 (0.02, 0.64). The distance between the coordinates 808, 816 is simply the distance between the Y coordinates (i.e. 0.64−0.57=0.07) is the total distance since the X coordinates are the same. Given the coordinate system established in this example (between 0.0 and 1,1), the distance in the coordinate system (0.07) may readily be converted into an equivalent linear distance measurement based in inches, feet, meters, etc.

In some embodiments, there may not be a continuous wall between the rays 804, 812 or coordinates 808, 816, and instead a series of two or more walls at different angles are between coordinates 808, 816. In these cases, each of the wall sections between the coordinates 808, 816 are converted into joined line segments, and the distance between coordinates 808, 816 is the sum of the lengths of the line segments. Flow proceeds to block 1152.

At block 1152, a total distance of construction work completed is updated with the calculated distance. The total distance may reflect a complete project or a portion of a project (plumbing work, for example), and is stored for reference by the image processing device 200. This maintains a running total of work performed to date (% complete or quantity), which may be compared to a construction schedule in order to determine if a project or a portion of a project is ahead of schedule, on schedule, or behind schedule.

In some embodiments, the construction progress may include a number of construction elements or portion of construction elements completed within a current period of time or sampling interval. For example, construction progress may be reflected in "38 pipes", "16.4 framed walls", or "4 junction boxes".

In some embodiments, a notification may be provided in response to one or more of the calculated construction progress or the total construction progress does not match the schedule. The notification may include a difference between the one or more of the calculated construction progress or the total construction progress and the schedule. Flow proceeds to block 1156.

At block 1156, the calculated distance is determined to be a % of the total distance. Therefore, if the total distance is 1000 feet and the calculated distance is 100 feet, then the calculated distance is 10% of the total distance. In another embodiment, instead of a % completion, a determined quantity (e.g., square feet, linear feet, etc) may be used instead. Flow proceeds to block 1160.

At block 1160, other photos or frames may be sampled in order to include additional calculations from various different 360/non-360 frames to recalculate construction progress of various building elements and establish a higher level of confidence. For example, a building location 104 may have several 360 degree photos taken five feet apart from each other, but they may "detect" the same wall that was installed. This may be important because there may be sources of inaccuracy (i.e. noise), such as inaccuracy of real-world accuracy of the (X,Y) location, segmentation of objects in the photo due to blurriness or inaccuracy of computer vision (where the yaw/pitch parallel lines 660 are calculated from), common orientation locations found in each photo, etc. This may result in calculations for perhaps nine out of ten photos will conclude a building element is installed, however, one out of ten may conclude it is not installed. This provides a statistics-based approach to determine that a construction element is actually installed, with a useful degree of confidence.

In one embodiment, there may be a minimum number of corroborating photos or frames required that correctly identify a construction element as being installed. In one embodiment, if the minimum number of photos or frames are not available, then a user may override the minimum number and construction progress calculation may proceed based on less than the required number of corroborating photos or frames. In another embodiment, if the minimum number of photos or frames are not available, then a user may be required to obtain the minimum number in order to proceed with the construction progress calculation. Flow continues to block 1164.

At block 1164, finally the progress has been determined for the current interval or measurement event, and the progress (updated total distance or % of total distance) is compared to a construction schedule. Alternatively, quantities of units of one or more construction elements may be determined (e.g. linear feet of stud framing, square feet of drywall, cubic yards of concrete, etc). The results of the comparison may be stored in the memory 208 of the image processing device, a construction schedule, in enterprise resource planning (ERP) software, in a financial or labor tracking system, in cloud storage, or in any single or combination of storage locations. Flow ends at block 1164.

Referring now to FIG. 12, a flowchart illustrating a flowchart illustrating mapping yaw lines to 2D coordinates 1140 in accordance with embodiments of the present invention is shown. FIG. 12 illustrates process steps to convert the yaw lines from blocks 1128, 1132, and 1136 of FIG. 11 into (X,Y) coordinate pairs within the 2D drawing, where the 2D drawing is a 2D floor plan. Flow begins at block 1204.

At block 1204, line segments 634 are identified in each image 112. Line segments 634 correspond to objects of interest or building elements for which progress will be measured. In the example of FIG. 6C, line segments 634 correspond to framing progress for framed sections 638. Flow proceeds to block 1208.

At block 1208, the mapped line segments 634 in each captured image 112 are mapped to the 2D floor plan. Once mapped within the 2D floor plan, the line segments are available for intersection determination. Flow proceeds to block 1212.

At block 1212, yaw degree lines in each photo or frame are converted into rays 804, 812 in the 2D floor plan. Flow proceeds to block 1216.

At block 1216, intersection coordinates 808, 816 are determined between each ray 804, 812 and line segments 634. Flow returns to block 1144 of FIG. 11.

Referring now to FIG. 13A, a photo or frame 1300 prior to segmentation in accordance with embodiments of the present invention is shown. FIGS. 13A-13C illustrates an embodiment illustrating adding yaw or pitch lines based on segmentation, using an exterior building 104 photo 1304. Unlike the previous examples that focused more on yaw 336 (left-right) construction progress tracking, FIGS. 13A-13C illustrates a focus on pitch lines and pitch (up-down) construction progress.

The photo 1304 of FIG. 13A shows an exterior building construction photo, where a series of new floor are being constructed or have been constructed, and more construction remains. The floors that have has preliminary construction completed are shown illuminated, while the top two floors have not yet been started.

Referring now to FIG. 13B, a photo or frame 1312 illustrating a segmented area in accordance with embodiments of the present invention is shown. The segmented area is identified by dashed lines, and identifies construction elements completed since a previous update.

In the example of FIG. 13B, the top two floors have been completed since the previous update, and reflect a newly constructed section 1316.

Referring now to FIG. 13C, a photo or frame 1324 illustrating added yaw and pitch line pairs in accordance with embodiments of the present invention. Once each newly constructed section 1316 has been defined, a pair of yaw lines 1328, 1332 and a pair of pitch lines 1336, 1340 are added to define yaw and pitch boundaries, respectively, for each newly constructed section. Each pair of yaw lines 1328, 1332 and pitch lines 1336, 1340 make up a parallel line pair 660. Because the view is perpendicular to the ground rather than parallel to the ground, it is mapped to an X-Z, Y-Z, or Y=bX+t (b=slope, t=Y intercept), basically any plane that is perpendicular to ground).

In one embodiment, between the 1328, 1332 and pitch lines 1336, 1340 a number of specific elements or portion(s) of specific elements may be determined or calculated. An "element" may be one entire line, but the yaw lines 644, 648 or pitch lines 652, 656 may extend to the middle of a line. In that case, it may include just a portion of that line, and not the entire line—therefore the calculation may count or determine not how many of a construction element are present, but instead a portion therof (i.e. 50% of a line, ceiling, etc.).

From the examples herein, it may readily be seen that integrating progress information with a common schematic (2D floor plan or elevation plan) aids in rapid understanding of the current status of construction or revisions to buildings and construction sites. Identifying differences between the current state of construction and previous construction images provides those with detailed knowledge or various stakeholders current information on both the state and the quality of construction. By identifying such differences rapidly, simple differences or errors may be corrected or planned for, and expensive and elaborate mistakes may be avoided.

The various views and illustration of components provided in the figures are representative of exemplary systems, environments, and methodologies for performing novel aspects of the disclosure. For example, those skilled in the art will understand and appreciate that a component could alternatively be represented as a group of interrelated sub-components attached through various temporarily or permanently configured means. Moreover, not all components illustrated herein may be required for a novel embodiment, in some components illustrated may be present while others are not.

The descriptions and figures included herein depict specific embodiments to teach those skilled in the art how to make and use the best option. For the purpose of teaching inventive principles, some conventional aspects have been simplified or omitted. Those skilled in the art will appreciate variations from these embodiments that fall within the scope of the invention. Those skilled in the art will also appreciate that the features described above can be combined in various ways to form multiple embodiments. As a result, the invention is not limited to the specific embodiments described above, but only by the claims and their equivalents.

Finally, those skilled in the art should appreciate that they can readily use the disclosed conception and specific embodiments as a basis for designing or modifying other structures for carrying out the same purposes of the present invention without departing from the spirit and scope of the invention as defined by the appended claims.

I claim:

1. A method comprising:
receiving, by an image processing device, one or more images from an image capture device, the one or more images each associated with metadata comprising a common direction, and for each of the one or more images:
adding one or more pairs of parallel lines, each pair of parallel lines designating one of the start or end of construction during a current period of time;
converting each of the one or more pairs of parallel lines into intersection coordinates with 2D drawing elements, the 2D drawing comprising a 2D floor plan or a 2D elevation plan; and
calculating construction progress from the intersection coordinates,
wherein each of the one or more images comprises one of a frame extracted from a video, a 360 degree photo, or a non-360 degree photo, wherein the one or more images are captured at predetermined locations associated with a building, wherein the metadata comprises a common direction reference for all captured images.

2. The method of claim 1, wherein each pair of parallel lines is one of oriented vertically and reflecting a pair of yaw values relative to the common direction or oriented horizontally and reflecting a pair of pitch values relative to a common unpitched value.

3. The method of claim 2, wherein prior to adding the one or more pairs of parallel lines to the one or more images, the method further comprising:
- identifying construction objects of interest to be tracked within each of the one or more images; and
- segmenting the construction objects of interest, comprising joining line segments enclosing each of the objects of interest.

4. The method of claim 3, the method further comprising:
- updating a total construction progress from the calculated construction progress, wherein the total and calculated construction progress reflects one of a percent complete or a quantity;
- comparing one or more of the calculated construction progress or the total construction progress to a schedule; and
- providing a notification in response to one or more of the calculated construction progress or the total construction progress does not match the schedule, wherein the notification comprises a difference between the one or more of the calculated construction progress or the total construction progress and the schedule.

5. The method of claim 3, wherein converting each of the one or more pairs of parallel lines into intersection coordinates with 2D drawing elements comprising:
- mapping line segments in the 2D drawing that corresponds to elements of the building;
- converting yaw or pitch degree lines added to each of the one or more images into rays in the 2D drawing, wherein each of the rays extends from a position where one of the images was captured to a location on an element that corresponds to a yaw or pitch line; and
- determining intersection coordinates where each ray intersects a first line segment along the ray.

6. The method of claim 5, wherein calculating construction progress from the intersection coordinates comprising one of:
- calculating a linear distance between intersection coordinates, wherein the linear distance comprises a distance along building elements between a pair of intersection coordinates; or
- calculating a number or portion of a specified element between the intersection coordinates; and
- consulting one or more different images and recalculating construction progress for the one or more different images to establish a higher construction progress confidence level.

7. An image processing device, comprising:
- a memory, comprising:
  - one or more applications;
  - a 2D drawing comprising building locations of a building, the 2D drawing comprising a 2D floor plan or a 2D elevation plan; and
  - one or more images of the building locations, each image associated with metadata comprising a common direction,
  - wherein each of the one or more images comprises one of a frame extracted from a video, a 360 degree photo, or a non-360 degree photo, wherein the one or more images are captured at predetermined locations associated with the building, wherein the metadata comprises a common direction reference for all captured images; and
- a processor, coupled to the memory, configured to execute the one or more applications to:
  - receive the one or more images from an image capture device, and for each of the one or more images:
    - add one or more pairs of parallel lines, each pair of parallel lines designates one of the start or end of construction during a current period of time;
    - convert each of the one or more pairs of parallel lines into intersection coordinates with 2D drawing elements; and
    - calculate construction progress from the intersection coordinates.

8. The system of claim 7, wherein each pair of parallel lines is one of oriented vertically and reflects a pair of yaw values relative to the common direction or oriented horizontally and reflects a pair of pitch values relative to a common unpitched value.

9. The system of claim 8, wherein prior to the processor adds the one or more pairs of parallel lines to the one or more images, the processor is configured to
- identify construction objects of interest to be tracked within each of the one or more images; and
- segment the construction objects of interest, comprising joined line segments that enclose each of the objects of interest.

10. The system of claim 9, wherein the processor is further configured to:
- update a total construction progress from the calculated construction progress, wherein the total and calculated construction progress reflects one of a percent complete or a quantity;
- compare one or more of the calculated construction progress or the total construction progress to a schedule; and
- provide a notification in response to one or more of the calculated construction progress or the total construction progress does not match the schedule, wherein the notification comprises a difference between the one or more of the calculated construction progress or the total construction progress and the schedule.

11. The system of claim 9, wherein the processor converts the one or more pairs of parallel lines into intersection coordinates with 2D drawing elements comprises the processor is further configured to:
- map line segments in the 2D drawing that correspond to elements of the building;
- convert yaw or pitch degree lines added to each of the one or more images into rays in the 2D drawing, wherein each of the rays extends from a position where one of the images was captured to a location on an element that corresponds to a yaw or pitch line; and
- determine intersection coordinates where each ray intersects a first line segment along the ray.

12. The system of claim 11, wherein the processor calculates construction progress from the intersection coordinates comprises the processor is further configured to one of:
- calculate a linear distance between intersection coordinates, wherein the linear distance comprises a distance along building elements between a pair of intersection coordinates; or
- calculate a number or portion of a specified element between the intersection coordinates; and
- consult one or more different images to recalculate construction progress for the one or more different images to establish a higher construction progress confidence level.

13. A non-transitory computer readable storage medium configured to store instructions that when executed cause a processor to perform:
- receiving, by an image processing device, one or more images from an image capture device, the one or more images each associated with metadata comprising a common direction, and for each of the one or more images:
- adding one or more pairs of parallel lines, each pair of parallel lines designating one of the start or end of construction during a current period of time;
- converting each of the one or more pairs of parallel lines into intersection coordinates with 2D drawing elements, the 2D drawing comprising a 2D floor plan or a 2D elevation plan; and
- calculating construction progress from the intersection coordinates, wherein each of the one or more images comprises one of a frame extracted from a video, a 360 degree photo, or a non-360 degree photo, wherein the one or more images are captured at predetermined locations associated with a building, wherein the metadata comprises a common direction reference for all captured images.

14. The non-transitory computer readable storage medium of claim 13, wherein each pair of parallel lines is one of oriented vertically and reflecting a pair of yaw values relative to the common direction or oriented horizontally and reflecting a pair of pitch values relative to a common unpitched value, wherein prior to adding the one or more pairs of parallel lines to the one or more images, the instructions are further configured to cause the processor to:
- identify construction objects of interest to be tracked within each of the one or more images; and
- segment the construction objects of interest, comprising joining line segments enclosing each of the objects of interest.

15. The non-transitory computer readable storage medium of claim 14, wherein the instructions are further configured to cause the processor to:
- update a total construction progress from the calculated construction progress, wherein the total and calculated construction progress reflects one of a percent complete or a quantity;
- compare one or more of the calculated construction progress or the total construction progress to a schedule; and
- provide a notification in response to one or more of the calculated construction progress or the total construction progress does not match the schedule, wherein the notification comprises a difference between the one or more of the calculated construction progress or the total construction progress and the schedule.

16. The non-transitory computer readable storage medium of claim 14, wherein converting each of the one or more pairs of parallel lines into intersection coordinates with 2D drawing elements comprising:
- mapping line segments in the 2D drawing that corresponds to elements of the building;
- converting yaw or pitch degree lines added to each of the one or more images into rays in the 2D drawing, wherein each of the rays extends from a position where one of the images was captured to a location on an element that corresponds to a yaw or pitch line; and
- determining intersection coordinates where each ray intersects a first line segment along the ray.

17. The non-transitory computer readable storage medium of claim 16, wherein calculating construction progress from the intersection coordinates comprising one of:
- calculating a linear distance between intersection coordinates, wherein the linear distance comprises a distance along building elements between a pair of intersection coordinates; or
- calculating a number or portion of a specified element between the intersection coordinates; and
- consulting one or more different images and recalculating construction progress for the one or more different images to establish a higher construction progress confidence level.

* * * * *